United States Patent
Ghadiri Moghaddam et al.

(10) Patent No.: US 10,834,855 B2
(45) Date of Patent: Nov. 10, 2020

(54) INTEGRATED MAKE-UP AIR SYSTEM IN 100% AIR RECIRCULATION SYSTEM

(71) Applicant: Nortek Air Solutions Canada, Inc., Saskatoon (CA)

(72) Inventors: Davood Ghadiri Moghaddam, Portland, OR (US); Philip Paul LePoudre, Saskatoon (CA); Manfred Gerber, Saskatoon (CA); Stephane Vivier, St.-Leonard d'Aston (CA)

(73) Assignee: Nortek Air Solutions Canada, Inc., Saskatoon (CA)

(*) Notice: Subject to any disclaimer, the term of this patent is extended or adjusted under 35 U.S.C. 154(b) by 74 days.

(21) Appl. No.: 16/067,446

(22) PCT Filed: Jan. 8, 2016

(86) PCT No.: PCT/CA2016/050016
§ 371 (c)(1),
(2) Date: Jun. 29, 2018

(87) PCT Pub. No.: WO2017/117644
PCT Pub. Date: Jul. 13, 2017

(65) Prior Publication Data
US 2019/0008076 A1  Jan. 3, 2019

(51) Int. Cl.
*H05K 7/20* (2006.01)
*F24F 3/044* (2006.01)
(Continued)

(52) U.S. Cl.
CPC ......... *H05K 7/20745* (2013.01); *F24F 3/044* (2013.01); *F24F 6/02* (2013.01);
(Continued)

(58) Field of Classification Search
CPC ..... F25B 25/005; F24F 3/1423; F24F 12/006; F24F 5/0035; F24F 2001/0092;
(Continued)

(56) References Cited

U.S. PATENT DOCUMENTS 1,746,598 A    2/1930  Ljungstrom
2,212,356 A *  8/1940  Shure ...................... F24F 5/001
                                                                62/409

(Continued)

FOREIGN PATENT DOCUMENTS

CA    2777916 A1    11/2012
CN    1265731 A     9/2000
(Continued)

OTHER PUBLICATIONS

"International Application Serial No. PCT/CA2016/050016, International Search Report dated Jul. 27, 2016", 4 pgs.
(Continued)

*Primary Examiner* — Jianying C Atkisson
*Assistant Examiner* — Jose O Class-Quinones
(74) *Attorney, Agent, or Firm* — Schwegman Lundberg & Woessner, P.A.

(57) ABSTRACT

Systems and methods for controlling conditions in an enclosed space can include an integral make-up air system that can be arranged in the interior of the housing for an air conditioning system that uses scavenger air in an air-to-air heat exchanger (AAHX) to condition process air from an enclosed space. The make-up air system can take replenishment air from outside the air conditioning system and deliver it into the process air stream. The make-up air system can include at least one heating or cooling device to condition the replenishment air before the replenishment air mixes with the process air. In an example, the make-up air system can include a DX coil to selectively cool and dehumidify the
(Continued)

replenishment air. The make-up air system can include a humidifier arranged in the flow path of process air between the process air inlet and the AAHX to selectively add humidity to the process air.

21 Claims, 11 Drawing Sheets

(51) Int. Cl.
  *F24F 6/02* (2006.01)
  *F24F 12/00* (2006.01)
  *F24F 13/30* (2006.01)

(52) U.S. Cl.
  CPC ............ *F24F 12/006* (2013.01); *F24F 13/30* (2013.01); *H05K 7/20827* (2013.01); *F24F 2203/104* (2013.01); *Y02B 30/563* (2013.01)

(58) Field of Classification Search
  CPC ........ F24F 2203/104; F24F 6/02; F24F 3/044; F24F 13/04; F24F 2011/0002; Y02B 30/563; Y02B 30/545; H05K 7/20745; H05K 7/20827; H05K 7/20145; H05K 7/20354
  See application file for complete search history.

(56) References Cited

U.S. PATENT DOCUMENTS

| | | | |
|---|---|---|---|
| 2,266,219 A * | | 12/1941 | Larriva ................. F24F 3/1423 62/92 |
| 2,964,298 A | | 12/1960 | McIntosh et al. |
| 3,640,090 A * | | 2/1972 | Ares ....................... F24F 1/022 62/436 |
| 3,789,916 A | | 2/1974 | Lindahl |
| 3,807,493 A | | 4/1974 | Stewart |
| 3,965,695 A | | 6/1976 | Rush et al. |
| 4,426,853 A | | 1/1984 | Mitani et al. |
| 4,470,342 A * | | 9/1984 | Hall, Jr. ............. G05D 23/1393 454/267 |
| 4,827,733 A | | 5/1989 | Dinh |
| 5,003,961 A | | 4/1991 | Besik |
| 5,238,052 A | | 8/1993 | Chagnot |
| 5,239,834 A | | 8/1993 | Travers |
| 5,490,557 A * | | 2/1996 | Taylor ................... F24F 12/006 165/54 |
| 5,579,647 A | | 12/1996 | Calton et al. |
| 5,649,428 A | | 7/1997 | Calton et al. |
| 5,660,048 A | | 8/1997 | Belding et al. |
| 5,727,394 A | | 3/1998 | Belding et al. |
| 5,758,508 A | | 6/1998 | Belding et al. |
| 5,771,707 A | | 6/1998 | Lagace et al. |
| 5,777,846 A | | 7/1998 | Hayes et al. |
| 5,791,153 A | | 8/1998 | Belding et al. |
| 5,826,443 A * | | 10/1998 | Ares ....................... A47F 3/001 62/324.1 |
| 5,832,988 A | | 11/1998 | Mistry et al. |
| 5,957,194 A | | 9/1999 | Azar |
| 6,003,327 A | | 12/1999 | Belding et al. |
| 6,004,384 A | | 12/1999 | Caudle |
| 6,018,953 A | | 2/2000 | Belding et al. |
| 6,029,462 A | | 2/2000 | Denniston |
| 6,034,873 A | | 3/2000 | Stahl et al. |
| 6,050,100 A | | 4/2000 | Belding et al. |
| 6,055,157 A | | 4/2000 | Bartilson |
| 6,083,300 A * | | 7/2000 | McFadden ........... B01D 53/261 95/113 |
| 6,104,003 A | | 8/2000 | Jones |
| 6,119,768 A | | 9/2000 | Dreier et al. |
| 6,141,979 A | | 11/2000 | Dunlap |
| 6,164,369 A | | 12/2000 | Stoller et al. |
| 6,199,388 B1 | | 3/2001 | Fischer |
| 6,201,705 B1 | | 3/2001 | Nygren et al. |
| 6,292,365 B1 | | 9/2001 | Ashiwake et al. |
| 6,305,180 B1 | | 10/2001 | Miller |
| 6,311,511 B1 | | 11/2001 | Maeda |
| 6,361,585 B1 * | | 3/2002 | Anzai ..................... B01D 53/06 95/113 |
| 6,409,157 B1 | | 6/2002 | Lundin |
| 6,430,044 B2 | | 8/2002 | Hutchinson et al. |
| 6,494,050 B2 | | 12/2002 | Spinazzola et al. |
| 6,507,494 B1 | | 1/2003 | Hutchison et al. |
| 6,557,365 B2 | | 5/2003 | Dinnage et al. |
| 6,557,624 B1 | | 5/2003 | Stahl et al. |
| 6,574,104 B2 | | 6/2003 | Patel et al. |
| 6,591,898 B1 | | 7/2003 | Chu et al. |
| 6,611,428 B1 | | 8/2003 | Wong |
| 6,612,365 B1 | | 9/2003 | Saishu et al. |
| 6,622,508 B2 | | 9/2003 | Dinnage |
| 6,625,017 B1 | | 9/2003 | Lin |
| 6,628,520 B2 | | 9/2003 | Patel et al. |
| 6,684,653 B2 | | 2/2004 | Des Champs et al. |
| 6,694,759 B1 | | 2/2004 | Bash et al. |
| 6,705,389 B1 | | 3/2004 | Stahl et al. |
| 6,711,907 B2 | | 3/2004 | Dinnage et al. |
| 6,714,412 B1 | | 3/2004 | Chu et al. |
| 6,719,038 B2 | | 4/2004 | Bird et al. |
| 6,742,583 B2 | | 6/2004 | Tikka et al. |
| 6,744,632 B2 | | 6/2004 | Wilson |
| 6,745,579 B2 | | 6/2004 | Spinazzola et al. |
| 6,745,826 B2 | | 6/2004 | Lowenstein |
| 6,747,872 B1 | | 6/2004 | Patel et al. |
| 6,786,056 B2 | | 9/2004 | Bash et al. |
| 6,819,563 B1 | | 11/2004 | Chu et al. |
| 6,867,967 B2 | | 3/2005 | Mok |
| 6,868,683 B2 | | 3/2005 | Bash et al. |
| 6,877,551 B2 | | 4/2005 | Stoller |
| 6,880,349 B2 | | 4/2005 | Johnson et al. |
| 6,917,522 B1 | | 7/2005 | Erturk et al. |
| 6,927,980 B2 | | 8/2005 | Fukuda et al. |
| 6,936,767 B2 | | 8/2005 | Kleinecke et al. |
| 6,973,801 B1 | | 12/2005 | Campbell et al. |
| 7,007,506 B2 | | 3/2006 | Kubo et al. |
| 7,017,655 B2 | | 3/2006 | Wilson |
| 7,042,722 B2 | | 5/2006 | Suzuki |
| 7,047,751 B2 | | 5/2006 | Dinnage et al. |
| 7,086,603 B2 | | 8/2006 | Bash et al. |
| 7,128,138 B2 | | 10/2006 | Des Champs |
| 7,139,169 B2 | | 11/2006 | Alperin et al. |
| 7,180,737 B2 | | 2/2007 | Straub, Jr. et al. |
| 7,187,547 B1 | | 3/2007 | French et al. |
| 7,222,660 B2 | | 5/2007 | Giacoma et al. |
| 7,262,964 B1 | | 8/2007 | Barsun |
| 7,274,568 B1 | | 9/2007 | Chayut |
| 7,278,273 B1 | | 10/2007 | Whitted et al. |
| 7,312,993 B2 | | 12/2007 | Bundza et al. |
| 7,313,924 B2 | | 1/2008 | Bash et al. |
| 7,315,448 B1 | | 1/2008 | Bash et al. |
| 7,319,596 B2 | | 1/2008 | Fujiya et al. |
| 7,347,058 B2 | | 3/2008 | Malone |
| 7,362,571 B2 | | 4/2008 | Kelley et al. |
| 7,379,299 B2 | | 5/2008 | Walsh et al. |
| 7,385,810 B2 | | 6/2008 | Chu et al. |
| 7,389,646 B2 | | 6/2008 | Moffitt |
| 7,392,836 B2 | | 7/2008 | Wong |
| 7,403,392 B2 | | 7/2008 | Attlesey et al. |
| 7,418,995 B2 | | 9/2008 | Howard et al. |
| 7,437,884 B2 * | | 10/2008 | Otake ................... F24F 3/1423 62/271 |
| 7,438,638 B2 | | 10/2008 | Lewis, II |
| 7,457,112 B2 | | 11/2008 | Fukuda et al. |
| 7,518,867 B2 | | 4/2009 | Yazawa et al. |
| 7,573,713 B2 | | 8/2009 | Hoffman et al. |
| 7,581,408 B2 * | | 9/2009 | Stark ....................... F24F 3/153 62/93 |
| 7,586,741 B2 | | 9/2009 | Matsushima et al. |
| 7,586,745 B1 | | 9/2009 | Szelong et al. |
| 7,591,868 B2 | | 9/2009 | Johnson |
| 7,595,985 B2 | | 9/2009 | Adducci et al. |
| 7,596,476 B2 | | 9/2009 | Rasmussen et al. |
| 7,604,534 B2 | | 10/2009 | Hill |
| 7,604,535 B2 | | 10/2009 | Germagian et al. |

(56) References Cited

U.S. PATENT DOCUMENTS

| | | | |
|---|---|---|---|
| 7,643,285 B2 | 1/2010 | Nishiyama et al. | |
| 7,647,787 B2 | 1/2010 | Belady et al. | |
| 7,675,748 B2 | 3/2010 | Matsushima et al. | |
| 7,679,909 B2 | 3/2010 | Spearing et al. | |
| 7,682,234 B1 | 3/2010 | Beitelmal et al. | |
| 7,716,829 B2 | 5/2010 | Des Champs | |
| 7,716,939 B1* | 5/2010 | Morales | H05K 7/20836 361/688 |
| 7,717,406 B2 | 5/2010 | Graef | |
| 7,729,115 B2 | 6/2010 | Hall et al. | |
| 7,733,648 B2 | 6/2010 | Fujiya et al. | |
| 7,753,766 B2* | 7/2010 | Master | H05K 7/20745 454/184 |
| 7,798,892 B2 | 9/2010 | Aiello et al. | |
| 7,830,658 B2 | 11/2010 | Van Andel | |
| 7,841,199 B2 | 11/2010 | VanGilder et al. | |
| 7,864,527 B1 | 1/2011 | Whitted | |
| 7,870,893 B2 | 1/2011 | Ouyang et al. | |
| 7,885,795 B2 | 2/2011 | Rasmussen et al. | |
| 7,895,854 B2 | 3/2011 | Bash | |
| 7,995,339 B2 | 8/2011 | Bash et al. | |
| 8,201,616 B2 | 6/2012 | Kim et al. | |
| 8,267,164 B2 | 9/2012 | Lestage et al. | |
| 8,267,758 B2 | 9/2012 | Liu | |
| 8,327,656 B2 | 12/2012 | Tutunoglu et al. | |
| 8,464,781 B2 | 6/2013 | Kenny et al. | |
| 8,631,661 B2 | 1/2014 | Teige et al. | |
| 8,743,542 B2* | 6/2014 | Kok | F24F 12/006 361/696 |
| 8,747,531 B2 | 6/2014 | Dinnage | |
| 8,978,741 B2 | 3/2015 | Sharma et al. | |
| 9,055,696 B2 | 6/2015 | Dunnavant | |
| 10,197,310 B2 | 2/2019 | Moghaddam et al. | |
| 2003/0050003 A1 | 3/2003 | Charron | |
| 2004/0060315 A1 | 4/2004 | Dinnage et al. | |
| 2007/0079623 A1 | 4/2007 | Inaba et al. | |
| 2007/0125110 A1 | 6/2007 | Abel | |
| 2008/0203866 A1* | 8/2008 | Chamberlain | F24F 1/0007 312/236 |
| 2010/0058778 A1 | 3/2010 | Bhatti et al. | |
| 2010/0192605 A1 | 8/2010 | Fang et al. | |
| 2010/0212345 A1* | 8/2010 | Yoon | F24F 3/1423 62/271 |
| 2011/0048687 A1 | 3/2011 | Des Champs | |
| 2011/0174003 A1 | 7/2011 | Wenger | |
| 2011/0256822 A1 | 10/2011 | Carlson | |
| 2011/0315350 A1 | 12/2011 | Curtis | |
| 2012/0131796 A1 | 5/2012 | Des Champs | |
| 2012/0167600 A1 | 7/2012 | Dunnavant | |
| 2012/0167610 A1 | 7/2012 | Dunnavant | |
| 2012/0168119 A1* | 7/2012 | Dunnavant | F24F 3/14 165/59 |
| 2012/0171943 A1* | 7/2012 | Dunnavant | H05K 7/20745 454/184 |
| 2012/0180505 A1 | 7/2012 | Gerber et al. | |
| 2012/0204717 A1 | 8/2012 | Dinnage | |
| 2012/0247135 A1* | 10/2012 | Fakieh | E03B 3/28 62/129 |
| 2012/0298334 A1 | 11/2012 | Madaffari et al. | |
| 2013/0010423 A1 | 1/2013 | Carlson | |
| 2013/0023196 A1 | 1/2013 | Fisher et al. | |
| 2013/0025450 A1* | 1/2013 | Sharma | B01D 53/06 95/113 |
| 2013/0094136 A1 | 4/2013 | Gross et al. | |
| 2013/0298580 A1 | 11/2013 | Dinnage | |
| 2014/0235157 A1 | 8/2014 | Wawryk | |
| 2015/0096714 A1* | 4/2015 | Dagley | F24F 12/003 165/8 |
| 2015/0208552 A1* | 7/2015 | Mornan | H05K 7/20745 165/247 |
| 2015/0369527 A1 | 12/2015 | Moghaddam et al. | |

FOREIGN PATENT DOCUMENTS

| | | |
|---|---|---|
| CN | 1717566 A | 1/2006 |
| CN | 101346588 A | 1/2009 |
| CN | 103827595 B | 4/2017 |
| CN | 107208910 A | 9/2017 |
| EP | 2079000 A2 | 7/2009 |
| EP | 1266548 B2 | 7/2015 |
| WO | WO-2008041788 A1 | 4/2008 |
| WO | WO-2013029148 A1 | 3/2013 |
| WO | WO-2014138851 A1 | 9/2014 |
| WO | WO-2015192249 A1 | 12/2015 |
| WO | 2016055759 | 4/2016 |
| WO | WO-2017117644 A1 | 7/2017 |

OTHER PUBLICATIONS

"International Application Serial No. PCT/CA2016/050016, Written Opinion dated Jul. 27, 2016", 4 pgs.

"European Application Serial No. 16882814.3, Response filed Feb. 22, 2019 to Communication Pursuant to Rules 161 and 162 dated Aug. 16, 2018", 9 pgs.

"European Application Serial No. 16882814.3, Extended European Search Report dated Jul. 10, 2019", 10 pgs.

"European Application Serial No. 16882814.3, Response filed Feb. 4, 2020 to Extended European Search Report dated Jul. 10, 2019", 14 pgs.

U.S. Appl. No. 14/744,950, U.S. Pat. No. 10,197,310 filed Jun. 19, 2015, Systems and Methods for Managing Conditions in Enclosed Space.

U.S. Appl. No. 16/230,958 filed Dec. 21, 2018, Systems and Methods for Managing Conditions in Enclosed Space.

"U.S. App. No. 14/744,950, Ex Parte Quayle Action dated Jul. 3, 2018", 5 pgs.

"U.S. Appl. No. 14/744,950, Non Final Office Action dated Sep. 19, 2017", 20 pgs.

"U.S. Appl. No. 14/744,950, Notice of Allowance dated Sep. 25, 2018", 5 pgs.

"U.S. Appl. No. 14/744,950, Preliminary Amendment filed Jun. 19, 2015", 7 pgs.

"U.S. Appl. No. 14/744,950, Response filed Mar. 16, 2018 to Non Final Office Action dated Sep. 19, 2017", 14 pgs.

"U.S. Appl. No. 14/744,950, Response filed Jun. 7, 2017 to Restriction Requirement dated Mar. 7, 2017", 12 pgs.

"U.S. Appl. No. 14/744,950, Response filed Ex Parte Quayle Action dated Jul. 3, 2018", 8 pgs.

"U.S. Appl. No. 14/744,950, Restriction Requirement dated Mar. 7, 2017", 10 pgs.

"Australian Application Serial No. 2015278221, First Examination Report dated May 20, 2019", 5 pgs.

"Case Study: Sabey Intergate.Quincy Oasis IEC", Munters Corp., [Online] Retrieved from the internet on Aug. 1, 2016: <URL: https://webdh.munters.com/webdh/BrochureUploads/Case%20Study-%20Sabey-Intergate-Quincy.pdf>, (2016), 2 pgs.

"Chinese Application Serial No. 201580044765.8, Office Action dated Mar. 3, 2020", w/ English Translation, 5 pgs.

"Chinese Application Serial No. 201580044765.8, Office Action dated Apr. 18, 2019", w/ English Translation, 13 pgs.

"Chinese Application U.S. Appl. No. 201580044765.8, Response filed Nov. 4, 2019 to Office Action dated Apr. 18, 2019", w/ English Claims, 12 pgs.

"Climate Wizard: How it Works", Seeley Intl., [Online] Retrieved from the internet on Aug. 1, 2016: <URL: http://www.climatewizard.com/how-it-works>, (2016), 3 pgs.

"Coolers & Humidifiers", Munters Oasis IEC-Americas, [Online] Retrieved from the Internet on Aug. 1, 2016: <URL: https://www.munters.corn/en/munters/products/coolers-humidifiers/oasis-indirect-evaporative-coolers-iect>, (2016), 2 pgs.

"Cooling Unit—Cooler Installation and Maintenance Instructions Sizes 14-16", Swegon AB, GB.Cooler.Inst.060501, (2006), 34 pgs.

"Datacom Equipment Power Trends and Cooling Applications", Ashrae, (2005), 124 pgs.

(56) References Cited

OTHER PUBLICATIONS

"Design Considerations for Datacom Equipment Centers", Ashrae, (2005), 204 pgs.
"European Application Serial No. 15809541.4, Communication Pursuant to Article 94(3) EPC dated Aug. 24, 2018", 5 pgs.
"European Application U.S. Appl. No. 15809541.4, Communication Pursuant to Article 94(3) EPC dated Aug. 26, 2019", 3 pgs.
"European Application Serial No. 15809541.4, Extended European Search Report dated Jan. 4, 2018", 7 pgs.
"European Application U.S. Appl. No. 15809541.4, Response filed Mar. 4, 2019 to Communication Pursuant to Article 94(3) EPC dated Aug. 24, 2018", 15 pgs.
"European Application U.S. Appl. No. 15809541.4, Response filed Mar. 5, 2020 to Communication Pursuant to Article 94(3) EPC dated Aug. 26, 2019", 21 pgs.
"European Application U.S. Appl. No. 15809541.4, Response filed Aug. 2, 2018 to Extended European Search Report dated Jan. 4, 2018", 16 pgs.
"European Application U.S. Appl. No. 15809541.4, Response filed Aug. 3, 2017 to Communication Pursuant to Rules 161(2) and 162 EPC dated Feb. 23, 2017", 4 pgs.
"GEA Adia-DENCO: Data center cooling with highest energy efficiency", GEA Group, [Online] Retrieved from the Internet on Aug. 1, 2016: <URL: http://eviss.bg/web/wp-content/uploads/2013/09/GEA-Adia-DNCO-Data-Facts-PDF-33-MB.pdf>, (Feb 2013), 10 pgs.
"High Performance Data Centers: A Design Guidelines Sourcebook", Pacific Gas and Electric Co., (Jan. 2006), 63 pgs.
"HTK-SE Hybrid Dry Cooler", Jaeggi Hybridtechnologie AG, [Online] Retrieved from the Internet on Aug. 1, 2016: <URL: http://www.jaeggi-hybrid.euffileadmin/literature/europelJAEGGI/HTK_SE/JAEGGI_HTK-SE_Info_EN.pdf>, (Jan. 6, 2014), 11 pgs.
"Indirect Adiabatic and Evaporative Data Centre Cooling", Excool Ltd., [Online] Retrieved from the Internet on Aug. 1, 2016: <URL http://excool.com/userfiles/files/Excool- Brochure.pdf>, (2016), 12 pgs.
"International Application Serial No. PCT/CA2015/050570, International Preliminary Report on Patentability dated Dec. 29, 2016", 6 pgs.
"International Application Serial No. PCT/CA2015/050570, International Search Report dated Dec. 29, 2016", 4 pgs.
"International Application Serial No. PCT/CA2015/050570, Written Opinion dated Sep. 1, 2015", 4 pgs.
"Kyoto Cooling(r) Utilizes Award-Winning Technology to Re-Invent Computer Room Air Conditioning (CRAC) Units with Release of Series 100", Air Enterprises, [Online] Retrieved from the internet on Dec. 5, 2014: <URL: http://airenterprises.com/?s-series+100&x=0&y-0>, (2014), 14 pgs.
"Oasis Product Guide", Munters Corp., [Online] Retrieved from the Internet on Aug. 1, 2016: <URL: https://www.munters.com/globalassets/inriver/resources/product_guide_oasis_europe_web.pdf>, (2016), 12 pgs.
"Operating and Maintenance Instructions for the Gold Air Handling Unit, Sizes 11-52", Swegon AB, GB.Goldsk.050101, (2005), 74 pgs.
"Series 100—Smarter cooling for data centers", Kyoto Cooling by Air Enterprises, [Online] Retrieved from the Internet: <URL: http://airenterprises.com/wp-content/uploads/2014/05/KyotoCooling-Series100-lowres.pdf>, (2014), 5 pgs.
"Sustainable cooling for data centres", Agentschap NL / NL Agency, Ministry of Economic Affairs, Agriculture an Innovation, (Jul. 2012), 26 pgs.
"The Coolerado HMX Difference", Seeley Intl., [Online] Retrieved from the Internet on Aug. 1, 2016: <URL: http://www.coolerado.com/products/hmx/>, (2016), 4 pgs.
"The Gold Air Handling Unit, version 4: Operation and Maintenance instructions", PM-Luft, (2000), 60 pgs.
"Thermal Guidelines for Data Processing Environments", Ashrae, (2004), 55 pgs.
Bonilla, Charles F., "Thermowheel Rotary Air-to-Air Heat Exchanger", Archives of Environmental Health: An International Journal, 4:3, (Mar. 4, 1962), 285-294.
Corbett, Robert J., et al., "Heat Recovery Ventilation for Housing", Superintendent of Documents, U.S. Government Printing Office, Washington, D.C. 20402, (Mar. 1984), 38 pgs.
Pesaran, Ahmad A., "A Review of Desiccant Dehumidification Technology", National Renewable Energy Laboratory, (Oct. 1994), 10 pgs.
Rasmussen, Neil, "Electrical Efficiency Modeling for Data Centers", American Power Conversion White Paper 113, (Oct. 26, 2005), 20 pgs.
Sullivan, Robert F., et al., "Analysis of the KyotoCooling Process: Introduction to the New KPN CyberCenters", Uptime Institute Research Underwriter White Paper, IT Symposium—Lean, Clean & Green, (2009), 13 pgs.

\* cited by examiner

INTEGRATED MAKE-UP AIR SYSTEM IN 100% AIR RECIRCULATION SYSTEM

CLAIM OF PRIORITY

This application is a U.S. National Stage Filing under 35 U.S.C. § 371 of International Patent Application No. PCT/CA2016/050016, filed on Jan. 8, 2016, and published on Jul. 13, 2017 as WO 2017/117644 A1, the benefit of priority of which is claimed hereby, and which is incorporated by reference herein in its entirety.

BACKGROUND

There are many applications for which controlling the environmental conditions within an enclosed space is important—for example, cooling data centers. A data center usually consists of computers and associated components operating 24 hours a day, 7 days a week. The electrical components in data centers produce a lot of heat, which needs to be removed from the space. Air-conditioning systems in data centers can consume as much as 40% of the total energy.

There are many different designs and configurations for air-conditioning systems for an enclosed space. One category of air-conditioning systems is 100% air recirculation systems in which the air from the enclosed space is conditioned by passing the process air through the air-conditioning system and then essentially 100% of the conditioned air is returned to the enclosed space. It is recognized that a small percentage of the air from the enclosed space may be lost due to inefficiencies in the air conditioning system. An indirect evaporative cooling (IDEC) unit is an example of a 100% air recirculation system. While the IDEC unit can provide significant energy savings, it may be necessary to provide a make-up air unit in order to meet ventilation requirements for the enclosed space.

Make-up air units may be required to periodically or continuously provide fresh outdoor air to the enclosed space. In some cases, a particular industry may have standard requirements for make-up or replenishment air. Data centers are an example of an industry having such requirements. For example, a data center may be required to provide 0.5 CFM/sq ft of fresh outdoor air to the process air contained in the data center. For a data center sized at 10,000 square feet, the exemplary requirement translates to providing 500 cubic feet per minute of fresh outdoor air to the data center.

A make-up air unit can filter the fresh outdoor air and condition the outdoor air based on the particular conditions of the outdoor air, which may require heating or cooling and humidification or dehumidification. The make-up air unit can be separate and external to the 100% air recirculation system. For example, the make-up air unit can be placed outside the enclosed space (on the roof or in a parking lot) or inside the enclosed space; but in both cases, the make-up air unit is separate from the 100% air recirculation system. In other examples, the make-up air unit can be an add-on module attached or otherwise connected to an external portion of the 100% air recirculation system.

An external make-up air unit can increase an overall footprint of the air conditioning system. The make-up air unit can require additional components, such as compressors, condensers or fans, which can occupy a significant amount of space and consume a significant amount of energy.

Typically the process air from the enclosed space, such as a data center, enters the 100% air recirculation system as hot and dry air. Because the process air continues to be circulated back to the data center, it can be challenging to efficiently maintain a humidity level of the process air, particularly under cold temperature conditions.

OVERVIEW

The present inventors recognize, among other things, an opportunity for improved efficiency in supplying make-up or replenishment air to the process air in an enclosed space which is conditioned using a 100% air recirculation system. The present inventors further recognize, among other things, improved efficiency in maintaining humidity levels of the process air as it continues to be circulated through the air conditioning system and back to the enclosed space.

The following non-limiting examples pertain generally, but not by way of limitation, to systems and methods of conditioning air in an enclosed space, such as a commercial or residential building, while efficiently providing make-up or replenishment air to the enclosed space. The following non-limiting examples are provided to further illustrate the systems and methods disclosed herein.

Examples according to the present application can include 100% air recirculation systems and methods that condition air from an enclosed space, such as, for example, a data center. The air conditioning system can include a housing formed by exterior walls that at least partially enclose components inside the housing. Essentially all of the air from the enclosed space (process air) can pass through the system and scavenger air can be used to condition the process air with an air-to-air heat exchanger (AAHX) arranged inside the housing. For cooling applications, such as a data center, the scavenger air can indirectly and sensibly cool the warm process air. The system can include an integral make-up air (MUA) unit arranged inside the housing, in the flow path of process air downstream of the AAHX. The make-up air unit can deliver make-up or replenishment air, from outside, into the flow path of process air. The replenishment air can mix with the process air after the process air exits the AAHX and before the process air is returned to the enclosed space.

In one example, the make-up air unit can be located in the process air flow path, downstream of the AAHX and upstream of the process air outlet. The make-up air unit can include a damper that can be selectively opened and closed to allow outside air to enter the housing as make-up or replenishment air for the enclosed space. The make-up air unit can include a filter to filter the replenishment air prior to adding it to the process air. The make-up air unit can be configured to selectively warm or cool the replenishment air. In an example, the make-up air unit can include a DX coil to selectively cool and dehumidify the replenishment air before the replenishment air enters the flow path of process air. The DX coil can be selectively used depending on the outdoor air conditions. If the outdoor air is cool, the DX coil may not be needed. In an example, the make-up air unit can include a heating device to selectively heat the replenishment air before the replenishment air enters the flow path of process air. In another example, the make-up air unit can include a DX coil and a heating device, and one of the DX coil or the heating device can be selectively turned on depending on the outdoor air conditions or the needs for warming or cooling the air in the enclosed space.

In one example, a humidifier can be arranged inside the housing between the process air inlet and the AAHX, and the humidifier can selectively humidify a portion of the process air. The humidifier can be located in other positions between the process air inlet and outlet. If the outdoor air temperature is cool but the air is dry, the humidifier can be used to add humidity to the overall process air. A combination of the make-up air unit and the humidifier can provide an integral make-up or replenishment air system. The make-up air unit and the humidifier can work in combination to help in maintaining a humidity level, as well as providing fresh, replenishment air, for the process air being returned to the enclosed space as cold aisle supply air.

Examples according to the present application, in which an integral make-up air system can be located inside the housing of the air conditioning system, can provide benefits as compared to an external unit. Because the make-up air system can be contained within the housing of the air conditioning system, the make-up air system does not increase an overall footprint of the air conditioning system. Components of the make-up air system, such as for example, compressors or condensers used in conjunction with the make-up air DX coil, can be physically located in a shared space with similar components used for other parts of the air conditioning system. In an example, the air conditioning system can include a DX coil located in the process air stream downstream of the AAHX to provide additional cooling to the process air, and a condenser for the make-up air DX coil can be disposed generally adjacent to a condenser coil for the main DX coil. The integral make-up air system can efficiently use the space within the housing of the air conditioning system by grouping components of the make-up air system with similar components included with the air conditioning system. In an example, one or more fans used for the condenser of the main DX coil can also be used for the condenser of the make-up air DX coil. This can contribute to energy savings for the air conditioning system, as compared to an air conditioning system having an external make-up air system.

In one example, a make-up air system can include a DX coil located inside the housing of the air conditioning system for cooling and dehumidifying the replenishment air, before it is added to the process air stream, and an external condenser unit located outside of the housing. The condenser unit can include a condenser coil in fluid communication with the make-up air DX coil. The condenser unit can be attached to the exterior of the housing.

Examples according to the present application, in which an integral make-up air system can include a humidifier in the process air stream, can provide additional energy savings as compared to an external make-up air system. In an application such as a data center, cooling of the process air is required year round. If the outdoor air is cool, it would be beneficial to add the cool air to the process air as replenishment air; however, the outdoor air is also dry. As such, existing external make-up air systems can heat up the outdoor air in order to provide humidification, and then supply the humidified replenishment air at a moderate temperature. As a result, a significant amount of energy can be used to heat and humidify the replenishment air. In contrast, the integral make-up air system disclosed herein can add cold, dry replenishment air directly into the process air stream. The humidifier, also located in the process air stream, can selectively provide humidification to all or a portion of the process air stream. In an example, the humidifier can be an evaporative cooler and the humidifier can also help with the cooling load of the overall system in addition to providing humidification. The replenishment air and the process air mix together at some location between the process air inlet and outlet, and once combined, provide return air for the enclosed space at a desired temperature and humidity level, using less energy overall compared to the external make-up air system described above.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present application relates to systems and methods for conditioning air in an enclosed space, such as, for example, a data center, using 100% air recirculation. The air conditioning systems described herein can include, but are not limited to, roof-top or end-on delivery applications. In an example, an air conditioning system can include a housing formed by exterior walls that at least partially enclose components inside the housing. An air-to-air heat exchanger (AAHX) can be arranged inside the housing in a flow path of process air and in a flow path of scavenger air. The system can include an integral make-up air (MUA) unit arranged inside the housing, in the flow path of process air downstream of the AAHX. The make-up air unit can deliver make-up or replenishment air, from outside, into the flow path of process air, after the process air exits the AAHX and before the process air is returned to the enclosed space.

The make-up air unit can include at least one heating or cooling device to condition the replenishment air. In an example, the make-up air unit can include a DX coil to selectively reduce a temperature of the replenishment air and dehumidify the replenishment air prior to it entering into the flow path of process air. In an example, the make-up air unit can include a heating device to selectively increase a temperature of the replenishment air prior to it entering into the flow path of process air. A humidifier can be arranged inside the housing, in the flow path of process air upstream of the AAHX, and can be configured to selectively humidify a portion of the process air. The combination of the make-up air unit and the humidifier can provide an integral make-up or replenishment air system. The design of an integral make-up air system inside the housing of the air conditioning system can provide benefits as compared to an external unit. This is described in further detail below.

Figure 1:
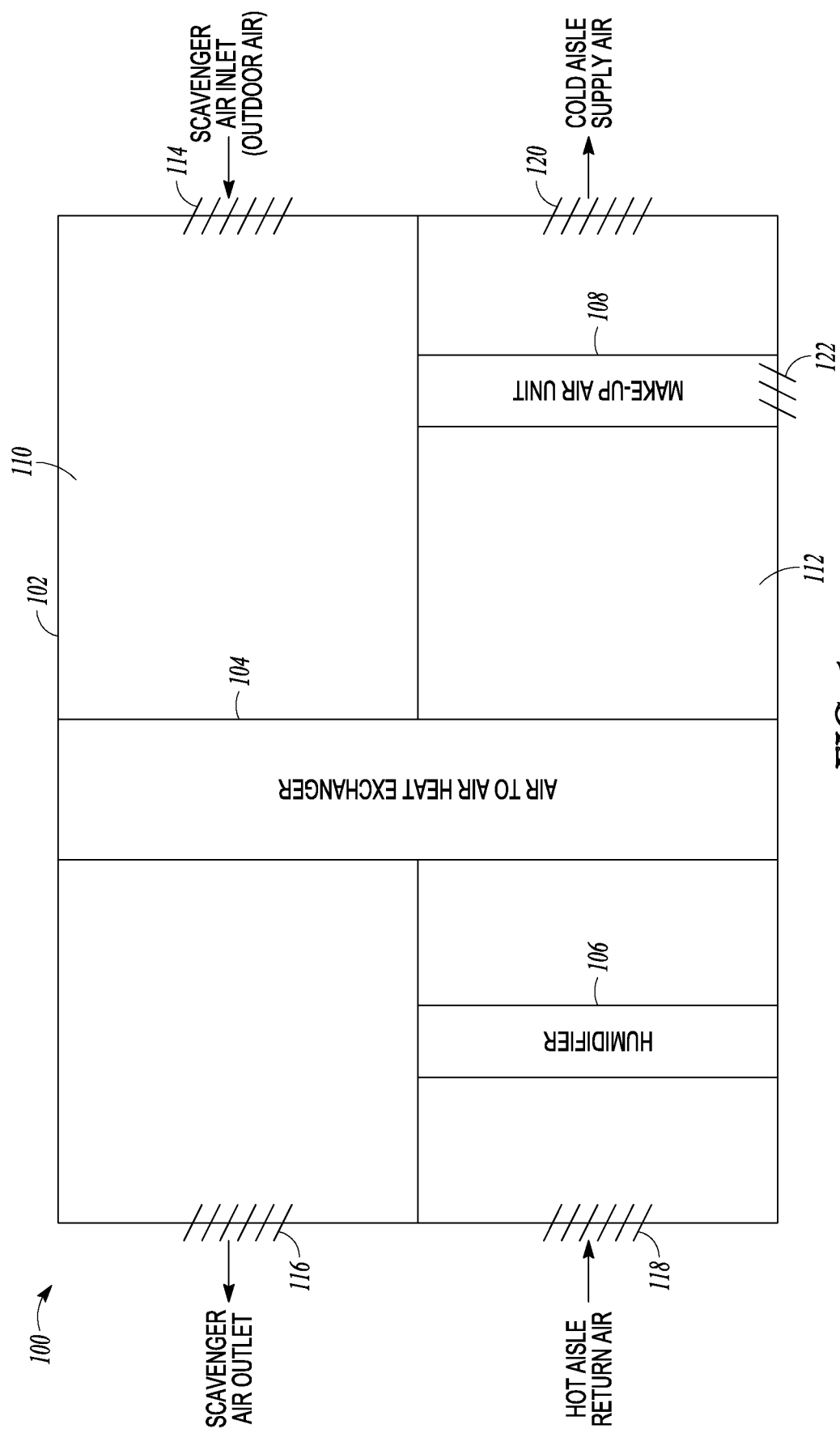
FIG. 1 is a schematic of an example air-conditioning system with an integrated make-up air system in accordance with the present patent application.

FIG. 1 depicts an example air-conditioning system 100, which can be configured as a roof-top system or end-on delivery system (for example, mounted to a side wall) for conditioning air from an enclosed space. The system 100 can include a housing 102 which can be formed by exterior walls that at least partially enclose the components located inside the housing 102. Such components can include an air to air heat exchanger (AAHX) 104, a humidifier 106 and a make-up air (MUA) unit 108. The housing 102 can be configured as a two-level unit in which a scavenger air stream flows through a top level 110 and a process air stream flows through a bottom level 112.

The scavenger air stream, or outdoor air, can enter the top level 110 through a scavenger air inlet 114 and can exit the top level 110 through a scavenger air outlet 116. The process air stream, from the enclosed space (a data center, for example), can enter the bottom level 112 at a process air inlet 118 as hot aisle return air and can exit the bottom level 112 at a process air outlet 120 as cold aisle supply air. The scavenger air inlet 114 and outlet 116, as well as the process air inlet 118 and outlet 120, can be configured as dampers such that the inlets and outlets can be selectively open or shut to allow or prevent air flow.

The AAHX 104 can be arranged at least partially in the top level 110 and at least partially in the bottom level 112 such that the scavenger air and the process air pass through the AAHX 104. In an example, the scavenger air flow path and the process air flow path can remain separate from one another in the housing 102. In an example, the scavenger air and process air flow paths can be in opposite directions. The data center or process air can be conditioned in the AAHX 104 using the scavenger air. In an example, the AAHX 104 can include, but is not limited to, a sensible wheel or a counter-flow flat plate heat exchanger. Other cooling components, including those described herein in reference to other examples of air conditioning systems, can be included with the AAHX 104 in the system 100, although not shown in FIG. 1.

The system 100 is an example of an air conditioning system having 100% air recirculation. Essentially all of the hot aisle return air that enters the bottom level 112 can be returned to the data center, or other enclosed space, as cold aisle supply air. It is recognized that some process air may be lost, for example, to leakage in the AAHX 104. Although the present application focuses on a data center as the enclosed space, the systems and methods disclosed herein for conditioning air can be used in other examples of enclosed spaces. Because the data center is always producing heat, the air conditioning system is used year-round in that application to cool the process air from the data center.

In other applications for an enclosed space, such as, for example, an office building, the air conditioning system 100 can be used to provide heating, or heating and cooling, depending on the outdoor air conditions. The air conditioning system can thus include additional components not shown and described herein to provide heating/cooling and humidification/dehumidification capabilities.

In an example, the make-up air unit 108 can be located in the bottom level 112 in the process air flow path, downstream of the AAHX 104 and upstream of the process air outlet 120. The make-up air unit 108 can include an air inlet 122 that can be selectively opened and closed to allow outside air to enter the housing 102 as make-up or replenishment air for the enclosed space. In an example, the humidifier 106 can be located in the bottom level 112 in the process air flow path, downstream of the process air inlet 118 and upstream of the AAXH 104.

Outside air that enters the housing 102 through the make-up air unit 108 can be essentially the same source of air that is defined as scavenger air that passes through the top level 110 of the housing 102, opposite to the process air. To eliminate any confusion, the outside air used to cool the process air is referred to herein as "scavenger air" and the outside air used as fresh air or make-up air that is added to the process air is referred to herein as "replenishment air" or "make-up air".

The make-up air unit 108 can be configured to deliver replenishment air into the process air flow path such that replenishment air can be continuously or periodically added to the process air being returned to the enclosed space as cold aisle supply air. The make-up air unit 108 can include a filter to filter the replenishment air prior to introducing the replenishment air into the process air stream. In an example, the make-up air unit 108 can include at least one heating or cooling device to condition the replenishment air prior to introducing the replenishment air into the process air stream. In an example, the make-up air unit can include a DX coil (see FIG. 3C) to cool and dehumidify the replenishment air prior to the replenishment air entering into the flow path of the process air in the bottom level 112. The DX coil of the make-up air unit 108 can be selectively used depending on the outdoor air conditions. If the outdoor air temperature is cool, the DX coil may not be needed since, in that case, the outdoor air enters the housing 102 at a temperature appropriate for being supplied to the enclosed space as cold aisle supply air. In some examples, the outdoor air temperature can be cool but the outdoor air can be dry, and the humidifier 106 can be used to add humidity to the overall process air, as described below. In an example, the make-up air unit 108 can include a heating device (see FIG. 3D), in addition to or as an alternative to the DX coil, to warm the replenishment air prior to introducing it into the process air stream. Because the components of the make-up air unit 108 can be contained within the housing 102, the make-up air unit 108 does not increase an overall footprint of the air conditioning system 100. Additional details about the make-up air unit 108 are described further below in reference to FIGS. 3A-3C.

In an example, the humidifier 106 can be located in the flow path of the process air at a location between the process air inlet 118 and the AAHX 104. As described below, the humidifier 106 can be placed in other locations in the process air stream within the housing 102. The humidifier 106 can be used when the outdoor air temperature is cold, for example, in the winter, to humidify the process air prior to passing the process air through the AAHX 104. The humidifier 106 can help in maintaining a humidity level (or range)

for the process air, even when the outside air is cold and dry. The process air entering the humidifier 106 can be very warm and have low relative humidity, since it has come from the data center or other enclosed space. Thus the process air has good potential for humidification at this location in the housing 102.

In an example, a small portion of the process air flowing through the housing 102 can be directed through the humidifier 106 and the remaining portion of the process air can bypass the humidifier 106. Dampers can be used to modulate the flow of process air through the humidifier 106 and minimize pressure drop while providing an appropriate amount of humidification. This is described below in reference to systems 300 and 500. (See, for example, FIGS. 3B and 5C.) If the humidifier 106 is not needed (for example, during summer when air is warm and humid), dampers or other types of bypass features can be used such that the process air does not pass through the humidifier 106. Thus the humidifier 106 can be protected when it is not needed, and minimize pressure drop.

The humidifier 106 is shown in FIG. 1 located between the process air inlet 118 and the AAHX 104. In other examples, the humidifier 106 can be located between the AAHX 104 and the process air outlet 120. The humidifier 106 can be located in the process air flow path at any position between the process air inlet 118 and the process air outlet 120. In an example, the humidifier 106 can be a small direct evaporative cooler (DEC) that can cool a portion of the process air through an evaporative process. In other examples, the humidifier 106 can be any type of humidifier, such as, for example, a steam humidifier.

The humidifier 106 is described herein separately from the make-up air unit 108; however, it is recognized that the humidifier 106 and the make-up air unit 108 can be considered to collectively function as a make-up or replenishment air system for the air conditioning system 100. In existing designs of 100% air recirculation systems, a make-up air system is external to the air conditioning system. In the air conditioning systems described herein, the make-up air system is integral to the air conditioning system and can include the make-up air unit 108 and the humidifier 106. Similar functions of an external make-up air system can be achieved through the distribution of one or more components that can be located inside the housing 102 of the air conditioning system 100. The humidifier 106 can be placed within the flow path of the process air, upstream of the AAHX 104, to maintain or increase a humidity level of the process air. The make-up air unit 108 can be placed within the flow path of the process air, downstream of the AAHX 104, to add fresh, cool air into the process air flow path before the process air is returned to the enclosed space. In combination, the make-up air unit 108 and the humidifier 106 can help in maintaining a humidity level (or range), as well as providing fresh, replenishment air, for the cold aisle supply air returned to the enclosed space.

The make-up air unit 108 and the humidifier 106 can, in combination, maintain a humidity level for the process air. In summer or when the outdoor air is warm and humid, the DX coil of the make-up air unit 108 can be running such that the replenishment air entering the system 100 from outside can be cooled and dehumidified prior to being added to the process air stream. When the DX coil is running under those outdoor air conditions, the humidifier 106 can be off or bypassed since it may be unnecessary to further humidify the process air. In contrast, in winter or when the outdoor air is cold and dry, the DX coil of the make-up air unit 108 can be turned off since the replenishment air is already cool. However, the outdoor air can be dry. As such, the humidifier 106 can be used to add humidity to the process air stream. In both scenarios, the replenishment air mixes with the process air stream downstream of the humidifier 106 and the humidity levels of each can balance with each other to reach a target humidity level or range for the process air stream being returned to the enclosed space. Even though the humidifier 106 and the make-up air unit 108 can be located in different physical spaces within the system 100, the combination of the make-up air unit 108 and the humidifier 106 can be used to reach and maintain the target humidity value or range. Given the inclusion of the humidifier 106 in the process air stream, the outdoor air can be added to the process air stream (via the make-up air unit 108) even if the outdoor air is dry. This can eliminate the step of heating and humidifying the outdoor air, as is done in existing external make-up air systems, prior to adding the outdoor air as replenishment air. Elimination of this step can result in energy savings.

It is recognized that the make-up air unit 108 can be used independent of the humidifier 106 to provide replenishment air to the cold aisle supply air. The humidifier 106 is not required in the system 100, or in the other air conditioning systems shown and described herein. It is recognized that the humidifier 106 can be used independent of the make-up air unit 108 to humidify or maintain a humidity level of the process air from the data center or other enclosed space. The make-up air unit 108 is not required in the system 100, or in the other air conditioning systems shown and described herein.

Figure 2:
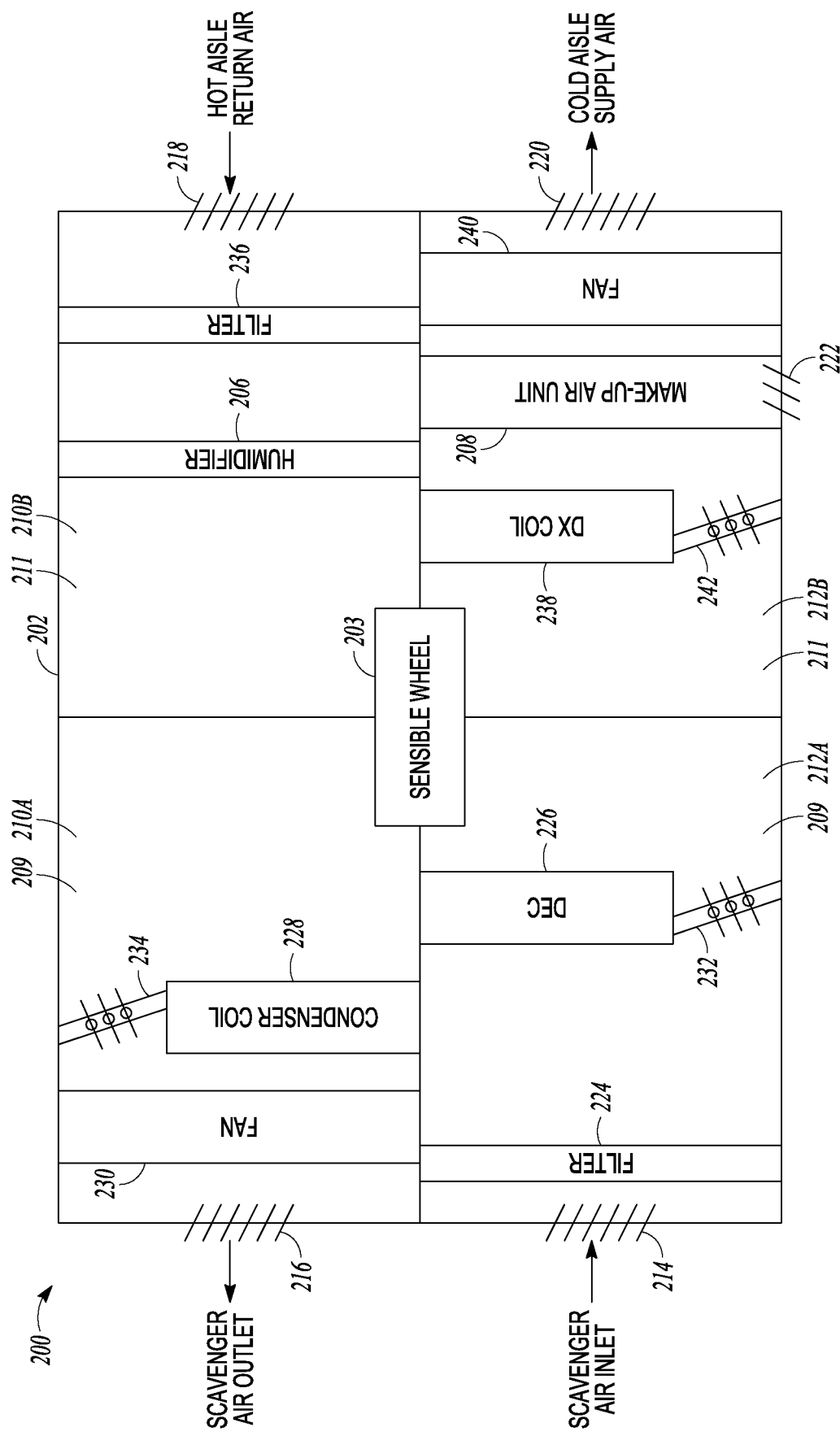
FIG. 2 is a schematic of an example air-conditioning system with an integrated make-up air system in accordance with the present patent application.

FIG. 2 depicts an example air conditioning system 200 that can be similar to the system 100 of FIG. 1. The system 200 can include a housing 202 defined by exterior walls that at least partially enclose the components of the system 200 inside the housing 202. In an example, the system 200 can include a sensible wheel 203, although it is recognized that another type of AAHX can be used in place or in addition to the sensible wheel of the system 200.

In an example, the sensible wheel 203 can be arranged horizontally. The housing 202 can be split into a first side portion 209 and a second side portion 211. The first side portion 209 can include a top level 210A and a bottom level 212A. The second side portion 211 can include a top level 210B and a bottom level 212B. The flow paths of the scavenger and process air in the housing 202 can be different, as compared to the flow paths in the housing 102 of FIG. 1. The scavenger air can enter the housing 202 through a scavenger air inlet 214 in the bottom level 212A, pass through the sensible wheel 203, and exit the housing 202 through a scavenger air outlet 216 in the top level 210A. The process air can enter the housing 202 through a process air inlet 218 in the top level 210B, pass through the sensible wheel 203, and exit the housing 202 through a process air outlet 220 in the bottom level 212B. In an example, the scavenger air and process air can flow opposite to one another in the sensible wheel 203.

The system 200 can include, similar to the system 100 of FIG. 1, a humidifier 206 and a make-up air unit 208 having an air inlet 222. The system 200 can include a filter 224 and a direct evaporative cooler (DEC) 226 located in the scavenger air flow path in the bottom level 212A upstream of the wheel 203. The system 200 can include a condenser coil 228 and a fan 230 located in the scavenger air flow path in the top level 210A downstream of the wheel 203. In an example, the DEC 226 and condenser coil 228 can each include a bypass damper 232 and 234, respectively.

The system 200 can include a filter 236 located in the process air flow path in the top level 210B upstream of the sensible wheel 203. The system 200 can include a DX coil 238 and a fan 240 located in the process air flow path in the bottom level 212B downstream of the sensible wheel 203. The DX coil 238 can include a bypass damper 242. It is recognized that not all of the components of the system 200 are required for operation of the system 200; likewise, it is recognized that additional components can be included in the operation of the system 200.

The DEC 226 can be configured to selectively cool the scavenger air prior to the scavenger air passing through the sensible wheel 203. The DX coil 238 can selectively provide additional cooling to the process air exiting the sensible wheel 203. The condenser coil 228 can be located in the scavenger air flow path and the scavenger air can pass through the condenser coil 228 to cool refrigerant from the DX coil 238. The cooling circuit for the DX coil 238 and the condenser coil 228 is not shown in FIG. 2, but the cooling circuit can also include a compressor and an expansion valve. The system 200 can operate in different modes depending on the outside air conditions and the cooling needed in the enclosed space, and hence the inclusion of the bypass dampers 232, 234 and 242. Reference is made to application Ser. No. 14/744,950, filed on Jun. 19, 2015, and entitled "SYSTEMS AND METHODS FOR MANAGING CONDITIONS IN ENCLOSED SPACE", which discloses additional configurations and details for 100% air recirculation systems.

The make-up air unit 208 can be configured similar to the make-up air unit 108 of the system 100. In the system 200 shown in FIG. 2, the make-up air unit 208 can be located in the bottom level 212B between the DX coil 238 and the process air outlet 220. The humidifier 206 can be configured similar to the humidifier 106 of the system 100. In the system 200 shown in FIG. 2, the humidifier 206 can be located in the top level 210B between the filter 236 and the sensible wheel 203. As described above in reference to the humidifier 106 of the system 100 in FIG. 1, the humidifier 206 can be located in other positions within the process air stream, and the flow of air through the humidifier 206 can be controlled and vary depending on the operating conditions.

A function of the make-up air unit 208 can be to periodically or continuously supply fresh or replenishment air to the process air being returned to the enclosed space as cold aisle supply air. The make-up air unit 208 can also function to counteract any leakage of process air in the sensible wheel 203 due, in part, to varying air pressures across the wheel 203. Air leakage from the process air stream to the scavenger air stream can, in some instances, lead to negative pressure which can increase the risk of infiltration. The make-up air unit 208 can mitigate this risk and pressurize the space inside the housing 202.

Figure 3A:
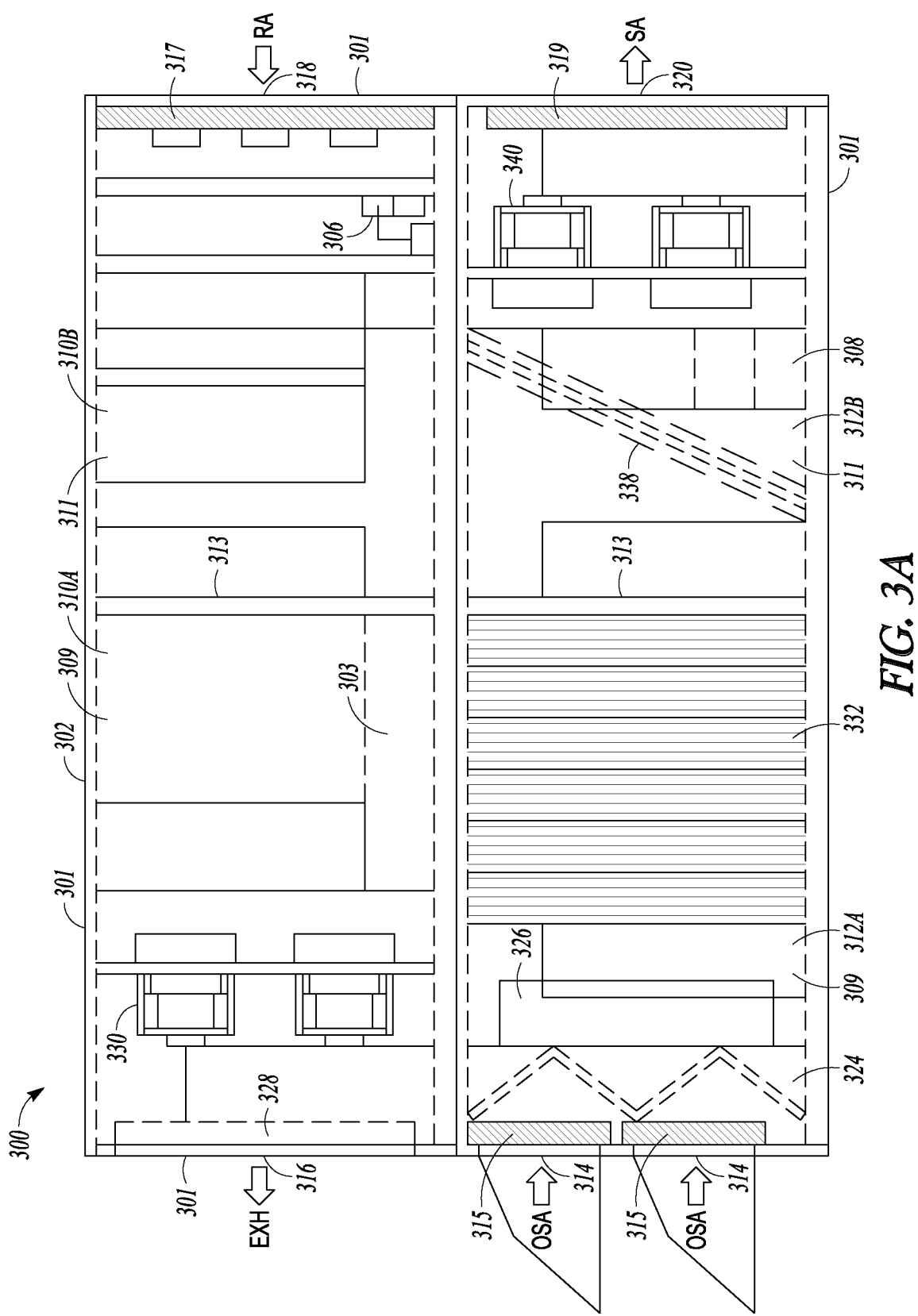
FIG. 3A is a side view of an air-conditioning system with an integrated make-up air system in accordance with the present patent application.
Figure 3B:
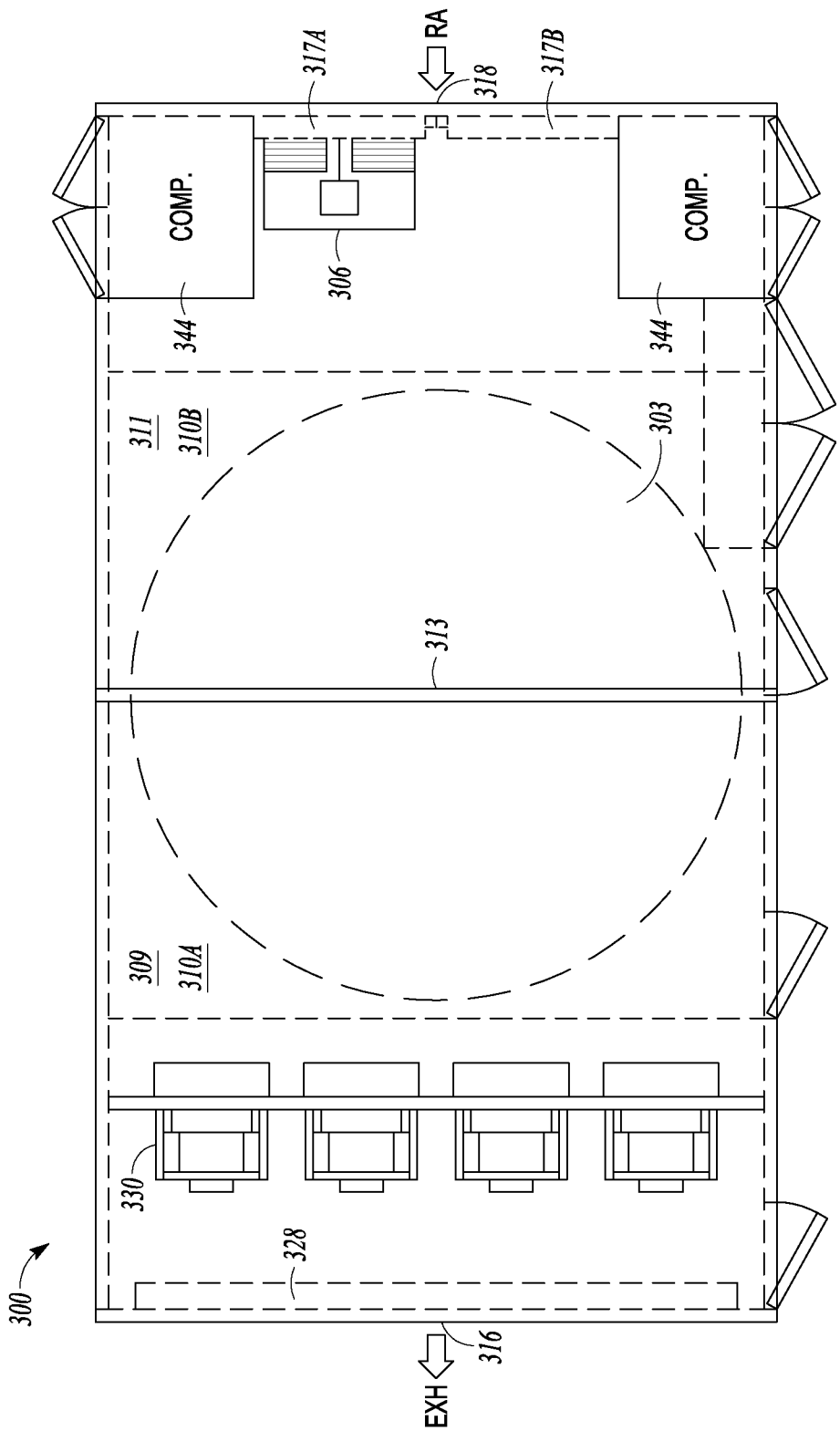
FIG. 3B is a top view of a top portion of the system in FIG. 3A.
Figure 3C:
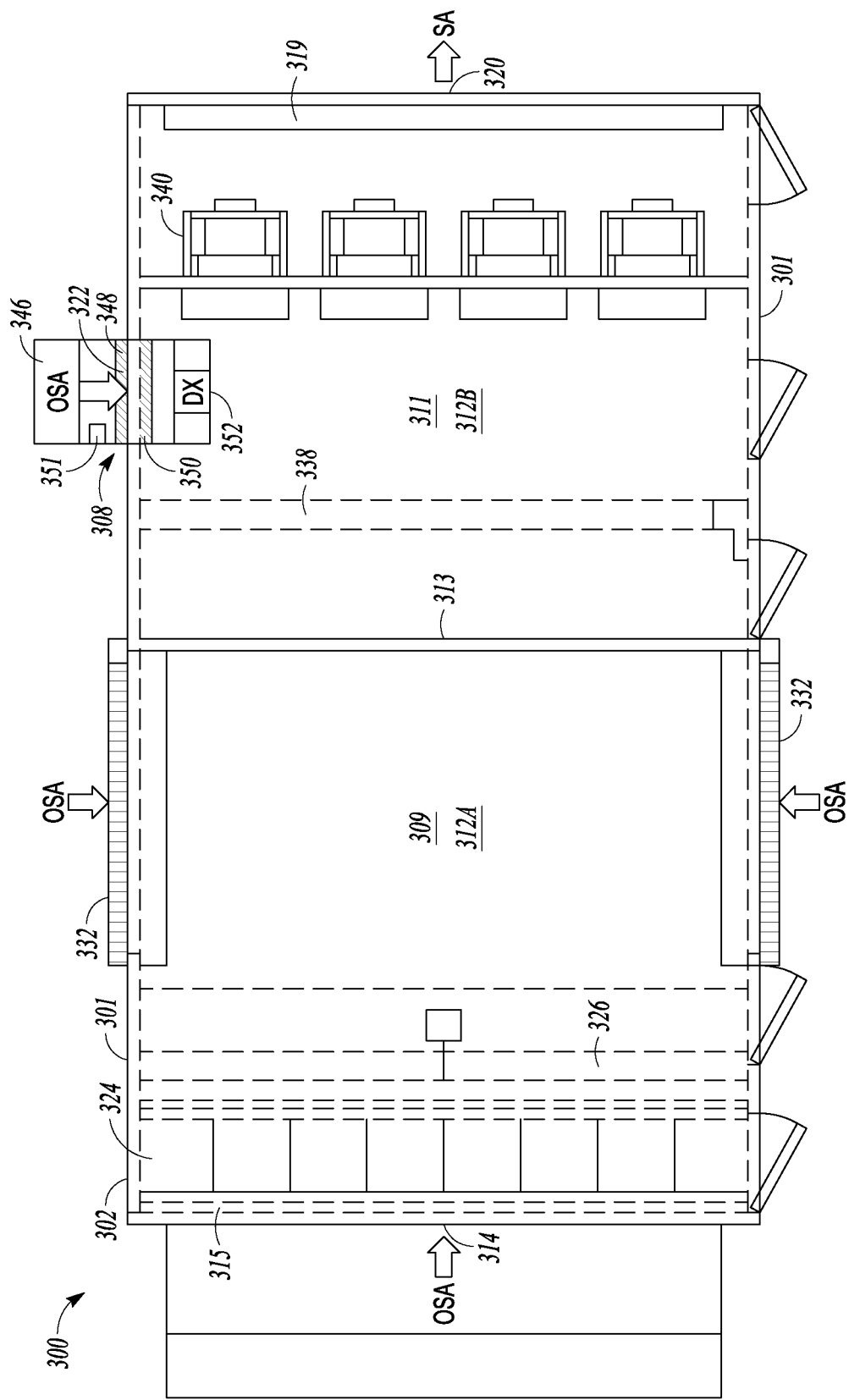
FIG. 3C is a top view of a bottom portion of the system in FIG. 3A.

The specific components of an integral make-up air unit, like the make-up air unit 208, are shown in an example system in FIGS. 3A-3C, which illustrate various views of a system 300 similarly configured to the system 200. The schematics of the systems 100 and 200 of FIGS. 1 and 2, respectively, are included herein to illustrate how and where the make-up air units 108 and 208, as well as the humidifiers 106 and 206, can be incorporated into the design of an 100% air recirculation system having an integral make-up air system. Additional details and benefits of an integral make-up air unit and humidifier are thus described further below in reference to FIGS. 3A-3C.

FIGS. 3A-3C depict an example of an air conditioning system 300 that can be similar to the system 200 of FIG. 2.

FIG. 3A is a side view of the system 300, which can include a housing 302 formed by a plurality of exterior walls 301. The housing 302 can include a top level 310 and a bottom level 312. FIG. 3B is a top view of the top level 310. FIG. 3C is a top view of the bottom level 312.

A sensible wheel 303 can be arranged horizontally in the housing 302, as described above for the sensible wheel 203 of the system 200. The housing 302 can be arranged as a first side portion 309 that receives the scavenger air and a second side portion 311 that receives the process air. The top level 310 can be divided by a partition 313 into a top level 310A of the first side portion 309 and a top level 310B of the second side portion 311. The bottom level 312 can be divided by the partition 313 into a bottom level 312A of the first side portion 309 and a bottom level 312B of the second side portion 311. The scavenger and process air streams can remain separate through the inclusion of the partition 313. The system 300 can include scavenger air inlet 314 and outlet 316 and process air inlet 318 and outlet 320.

The bottom level 312A of the first side portion 309 (which receives the scavenger air) can include one or more dampers 315 at the scavenger air inlet 314, a filter 324, a DEC 326 and a DEC bypass damper 332. The scavenger air can flow through the bottom level 312A, entering either at the scavenger air inlet 314 or the bypass damper 332, and then pass through the sensible wheel 303. As shown in FIG. 3C, the bypass damper 332 can include dampers on both walls 301 of the first side portion 309; it is recognized that the system 300 can include only one bypass damper 332.

The top level 310A of the first side portion 309 can include a condenser coil 328 and a plurality of fans 330. (The placement of the condenser coil 328 and the fans 330 is reversed in the system 300 as compared to their placement in the system 200 of FIG. 2.) The scavenger air exiting the sensible wheel 303 can flow through the fans 330 and the condenser coil 328 and exit the housing 302 through the scavenger air outlet 316. Although not shown in FIGS. 3A and 3B, the condenser coil 328 can, in some examples, include a bypass damper.

The top level 310B of the second side portion 311 (which receives the process air) can include one or more dampers 317 at the process air inlet 318 and a humidifier 306. In an example, the humidifier 306 can be a DEC, as described further below. The process air can enter the second side portion 311 through the process air inlet 318, pass through the humidifier 306 and then pass through the sensible wheel 303. As shown in FIG. 3B, the top level 310B of the second side portion 311 can include one or more compressors 344 on each side of the top level 310B. (The compressors 344 are not shown in FIG. 3A for simplicity.) It is recognized that in an example, one or more compressors 344 can be located on only one side of the top level 310B. The one or more compressors 344 can be part of a DX expansion system for a DX coil 338, described below. It is recognized that the one or more compressors 344 can be located in a different area within the housing 302. A total number of compressors in the one or more compressors 344 for use in the system 300 can vary, depending, for example, on a capacity and projected load for each compressor.

The bottom level 312B of the second side portion 311 can include the DX coil 338, make-up air unit 308, fans 340, and one or more dampers 319 at the process air outlet 320. The DX coil 338 can provide additional cooling to the process air exiting the sensible wheel 303. Although not shown in FIGS. 3A and 3C, the DX coil 338 can, in some examples, include a bypass damper.

As shown in FIG. 3C, the make-up air unit 308 can include a louver or hood 346, a damper 348 at an air inlet 322, a filter 350, an airflow sensor 351, and a DX coil 352. As described above, the make-up air unit 308 can be configured to deliver replenishment air (outside air surrounding the housing 302) to the process air stream in the bottom level 312B. The make-up air unit 308 can be located in the process air flow path between the sensible wheel 303 and the process air outlet 320. In an example, the replenishment air can be introduced into the flow path of process air at a location between the DX coil 338 and the fans 340. It is recognized that, in another example, the system 300 can exclude the DX coil 338 and the make-up air unit 308 can be located in the bottom level 312B between the sensible wheel 303 and the fans 340. The make-up air unit 308 is shown in FIG. 3C on one side of the bottom level 312B; it is recognized that it could be located on the other side of the bottom level 312B. In an example, the make-up air unit 308 can be located on both sides of the housing 302. A location of the make-up air unit 308 can depend, for example, on an overall size of the housing 302 and available space within the housing 302, depending on other components of the system 300.

The damper 348 can be configured to control the flow of outside air through the make-up air unit 308 and into the bottom level 312B. The damper 348 can be configured for various positions, including open, closed, partially open, and partially closed. The make-up air unit 308 can include one or more components for measuring and controlling the flow of replenishment air into the bottom level 312B, including the airflow sensor 351. In an example, such components can be used to control a position of the damper 348. In an example, replenishment air can be continuously supplied to the bottom level 312B during operation of the system 300. In an example, the damper 348 can switch between open and closed positions, and replenishment air can be periodically supplied to the bottom level 312B.

The make-up air unit 308 can include additional or alternative components to the airflow sensor 351 to control the flow of outside air through the make-up air unit 308. In an example, airflow through the make-up air unit 308 can be controlled by monitoring a pressure drop across the DX coil 352. In another example, airflow through the make-up air unit 308 can be controlled by monitoring and maintaining an overall building pressure.

The filter 350 can be included in the make-up air unit 308 such that the replenishment air can pass through the filter 350 prior to being added to the process air stream.

As shown in FIG. 3C, in an example, the replenishment air can enter the process air flow path upstream of and in close proximity to the fans 340. As such, suction of the fans 340 can pull the replenishment air into the process air flow path. In other examples, the make-up air unit 308 can be located in other positions as an alternative to its location shown in FIG. 3C. Depending on where the make-up air unit 308 is located and where the replenishment air is introduced into the process air flow path, a fan can also be included with the make-up air unit 308 to account for the positive pressure.

The DX coil 352 of the make-up air unit 308 can be configured to selectively condition the replenishment air prior to adding the replenishment air to the process air flow path. Use of the DX coil 352 can depend, in part, on the outdoor air conditions. For example, in the winter, when the outdoor air can be at a low temperature, the DX coil 352 can be turned off since the replenishment air can be at a sufficiently low starting temperature and it is not necessary to reduce its temperature prior to adding it to the process air flow path. The replenishment air can pass though the DX coil 352 when the DX coil 352 is off and the pressure drop can be small. In an example, the make-up air unit 308 can include a bypass for the DX coil 352 such that the replenishment air entering the make-up air unit 308 can pass through the filter 350, but then bypass the DX coil 352. It is recognized that an alternative cooling unit to a DX coil can be used in the make-up air unit 308 in addition to or as an alternative to the DX coil 352, such as, for example, a chilled water coil.

As described herein, the system 300 can include the main DX coil 338 for the process air stream and the DX coil 352 for the replenishment air being added to the process air stream. In another example, the DX coil 352 can be excluded from the system 300 and the DX coil 338 can be used to also condition the replenishment air. In such an example, the DX coil 338 may be designed for different operating conditions.

The inclusion of the DX coil 352 in the make-up air unit 308 can result in the addition of other components, such as, for example, a compressor or a condenser to cool a refrigerant used in the DX coil 352. In an example, the DX coil 352 can be part of a DX expansion system that can also include a condenser, a compressor, and an expansion valve. The DX expansion system can also include the main DX coil 338 in the bottom level 312B (for the process air exiting the wheel 303) and the condenser 328 in the top level 310A. In an example, the DX coil 352 (the make-up air DX coil) can use the condenser 328 for the main DX coil 338. In another example, a separate condenser for the make-up air DX coil 352 can be included in a shared space with the condenser 328 for the main DX coil 338 or disposed generally adjacent to the condenser 328. The condenser 328 as illustrated in FIG. 3A can represent one or more condensers—for example, a condenser for the main DX coil 338 and a condenser for the make-up air DX coil 352. In another example, the condenser for the DX coil 352 can be located in a location separate from the condenser 328. Such separate location can be inside the housing 302 or outside the housing 302 (see FIG. 6).

In an example, the DX expansion system for the DX coil 352 can include the one or more compressors 344 (see FIG. 3B) configured for use with the DX coil 338. Separate compressors within the one or more compressors 344 can be dedicated to the DX coil 338 or the DX coil 352, but the compressors can be located within a shared space within the housing 302. In another example, compressors for each of the DX coil 338 and the DX coil 352 can be located in separate locations in or outside the housing 302.

In an example, even if the condenser for the make-up air unit 308 is separate from the condenser 328, the condenser for the make-up air unit 308 can use the fans 330 that are already included in the system 300 for the condenser 328. This can result in energy and space savings as compared to a system in which the condenser for the make-up air unit 308 includes one or more fans dedicated to the make-up air condenser.

As described above, one or more components of the DX expansion system for the DX coil 352 can be disposed generally adjacent to or share a common space with similar components of the DX expansion system for the DX coil 338. Efficiency, in terms of physical space or energy usage for the system 300, can be achieved in some examples by physically grouping these components of the expansion system together.

The humidifier 306 can be located in the process air flow path in the top portion 310B. In an example, the humidifier 306 can be a DEC. In some cases, such DEC can be smaller compared to the DEC 326 in the scavenger air flow path. As described above in reference to the system 100, although the humidifier 306 is described separate from the make-up air unit 308, the humidifier 306 and the make-up air unit 308 can collectively be described as part of an integral make-up or replenishment air system. In an example, one or more components or features can be included with the humidifier 306 or the housing 302 to direct or control flow through the humidifier 306.

In an example, a first damper 317A can be included in the system 300 to selectively direct air from process air inlet 318 through the humidifier 306. The first damper 317A can be fluidly connected to the humidifier 306. A second damper 317B can be located generally adjacent to the first damper 317A. The second damper 317B can selectively direct air from process air inlet 318 and into the top level 310B of the housing 302. The process air passing through the second damper 317B can be diverted around the humidifier 306. A combination of the first and second dampers 317A and 317B can be used to control and modulate a flow of process air through the humidifier 306. In some examples, even during winter, a portion of the process air at the process air inlet 318 can pass through the first damper 317A and then through the humidifier 306; the remaining process air can pass through the second damper 317B. During warmer weather, such as summer, the humidifier 306 may not be needed in order to maintain the return process air at the target humidity level, and thus the first damper 317A can be closed and essentially all of the process air at the inlet 318 can enter through the second damper 317B. Depending on conditions of the outside air or the hot aisle return air from the enclosed space, some or all of the process air in the top portion 310B can be directed around the humidifier 306. Both dampers 317A and 317B can be adjusted such that each is open, closed, partially opened or partially closed. The position of one of dampers 317A or 317B can be independent of a position of the other damper 317A or 317B. In summary, inclusion of the dampers 317A and 317B in the system 300 facilitates control and variance of the flow of process air through the humidifier 306. It is recognized that less than or more than two dampers 317 can be used in other examples.

The system 300 is described above for use in providing cooling to the process air from the enclosed space. As described above in reference to FIG. 1, the system 300 can include additional or alternative components such that the system 300 can be used for heating an enclosed space or heating and cooling an enclosed space. The make-up air unit 308 and the humidifier 306 can function as described above.

Figure 3D:
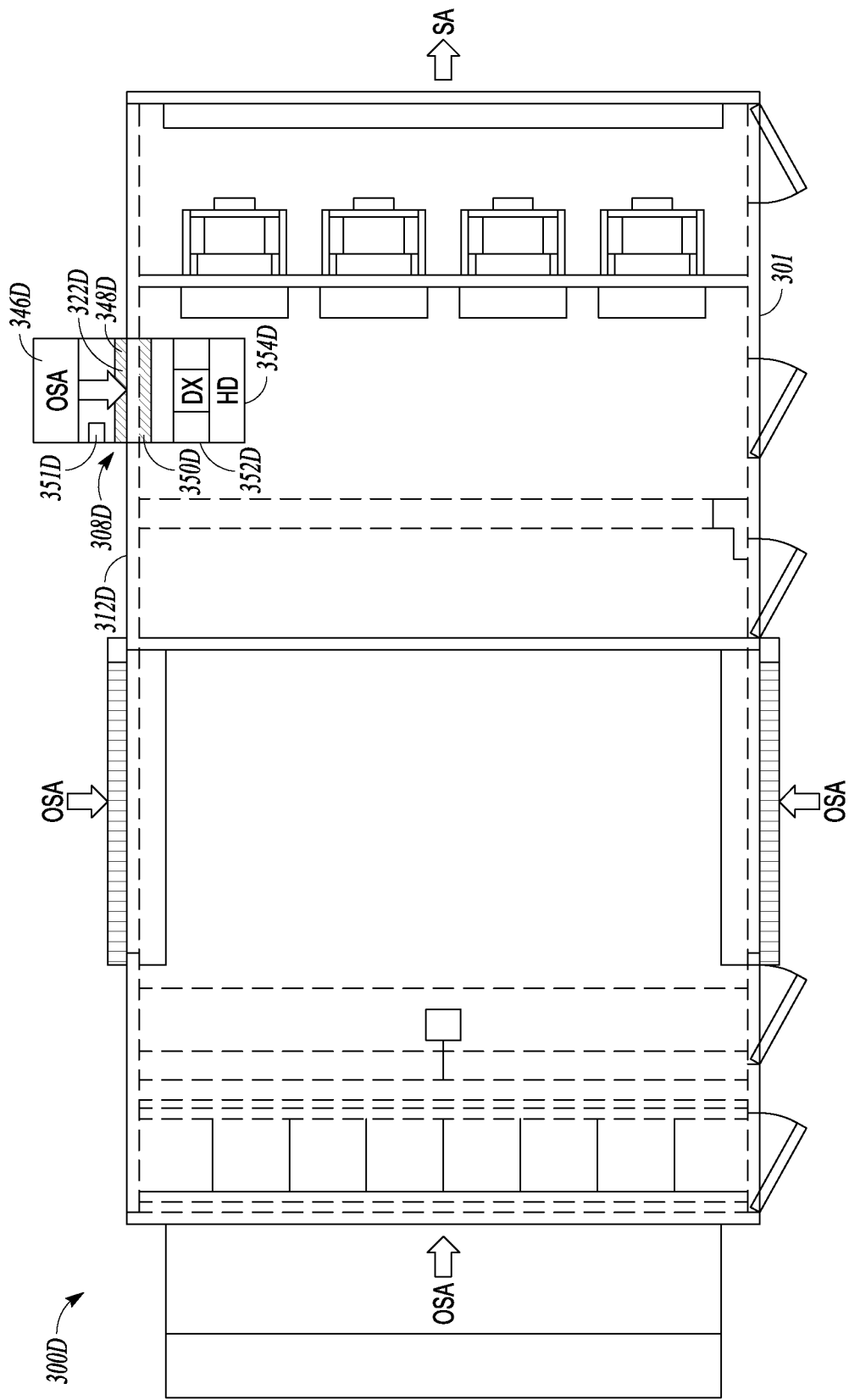
FIG. 3D is a top view of a bottom portion of an example air-conditioning system with an integrated make-up air system in accordance with the present patent application.

FIG. 3D depicts a top view of a bottom level 312D of an example air conditioning system 300D. The components in the air conditioning system 300D can be similar to those in the air conditioning system 300 described above and illustrated in FIGS. 3A-3C. However, the system 300D can include a make-up air unit 308D that can be configured to provide heating and cooling to the replenishment air. Similar to the make-up air unit 308 as shown in FIG. 3C, the make-up air unit 308D can include a louver or hood 346D, a damper 348D at an air inlet 322D, a filter 350D, a sensor 351D, and a DX coil 352D. The make-up air unit 308D can include a heating device 354D. In an example, the heating device 354D can be connected directly to the DX coil 352D. The heating device 354D can be configured to provide heating to the replenishment air entering the make-up air unit 308D. The heating device 354D can include, but is not limited to, an electric heater or a hot water coil. Although the make-up air unit 308D is shown in FIG. 3D as having the DX coil 352D upstream of the heating device 354D, it is recognized that in other examples the arrangement can be changed and the replenishment air can pass through the heating device 354D first and then pass through the DX coil 352D.

As shown in FIG. 3D, the DX coil 352D and the heating device 354D can be arranged in series. However, during operation of the system 300D, one of the DX coil 352D or the heating device 354D can be turned on, and the other can be turned off, such that the replenishment air can be warmed or cooled depending on the outdoor air conditions or the needs of the system 300D to warm or cool the enclosed space. It is recognized that, at times during operation of the system 300D, the replenishment air may be neither warmed nor cooled, and both of the DX coil 352D and the heating device 354D can be turned off. Given a low pressure drop across the DX coil 352D and the heating device 354D, the make-up air unit 308C can operate without a bypass for the DX coil 352D or the heating device 354D. However, it is recognized that a bypass can be used in the make-up air unit 308D for one or both of the DX coil 352D and the heating device 354D.

In another example, the air conditioning system 300 or 300D can include a make-up air unit having a heating device, like the heating device 354D, and excluding the DX coil 352D.

Figure 4:
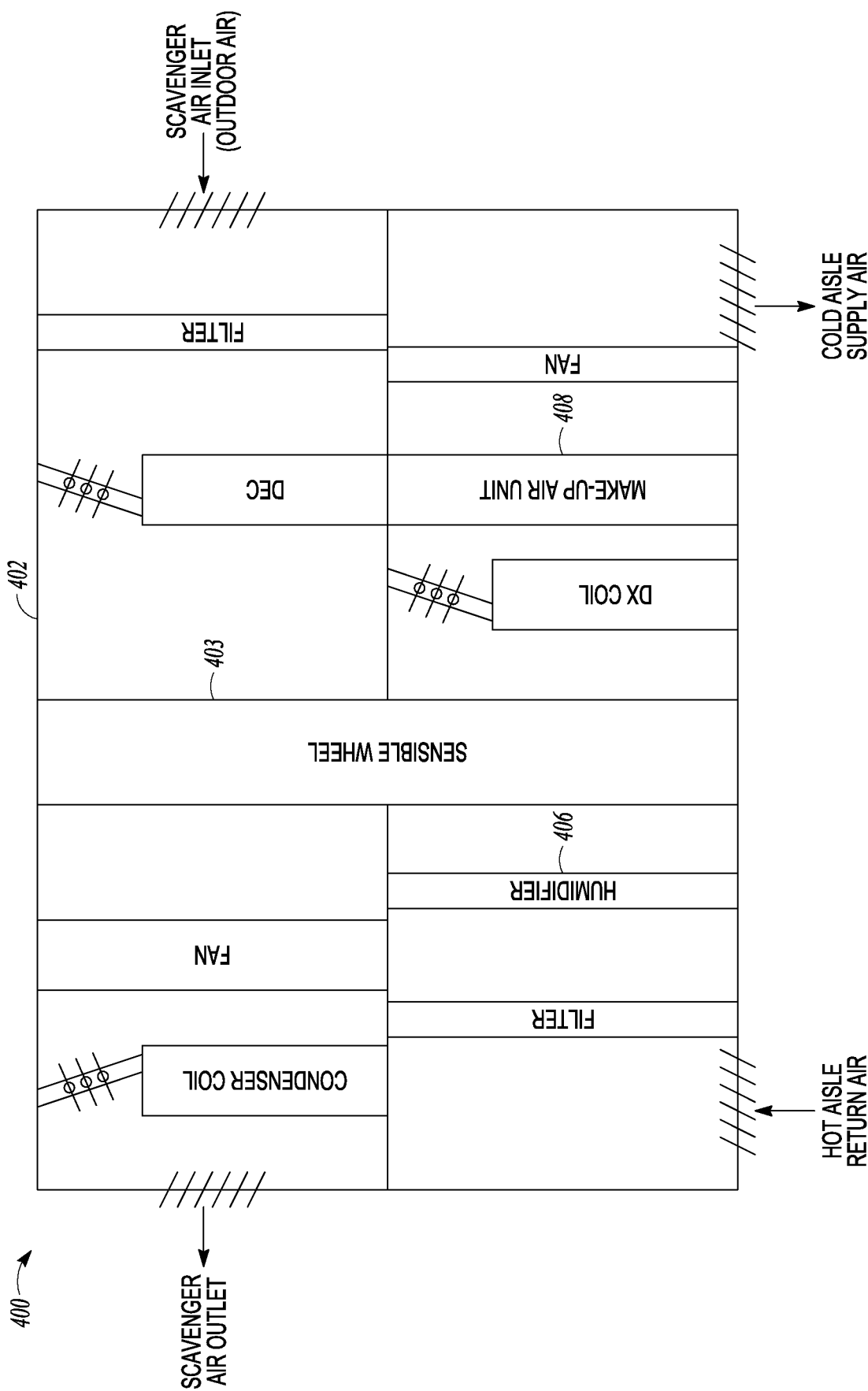
FIG. 4 is a schematic of an example air-conditioning system with an integrated make-up air system in accordance with the present patent application.

FIG. 4 depicts an example air conditioning system 400 that can be similar to the system 200 of FIG. 2, but the system 400 can include a vertically-oriented sensible wheel 403 in contrast to the horizontally-oriented sensible wheel 203 in the system 200. A flow path of the process air and a flow path of the scavenger air can be similar to the flow paths described above in relation to the system 100 of FIG. 1. The system 400 can include a make-up air unit 408 and a humidifier 406, both located inside a housing 402 of the system 400. The other components of the system 400 can be similar to those described above in the systems 200 and 300 of FIGS. 2 and 3A-3C. FIG. 4 illustrates that the integral make-up air units and humidifiers described above can be incorporated into various designs of 100% air recirculation systems.

Figure 5A:
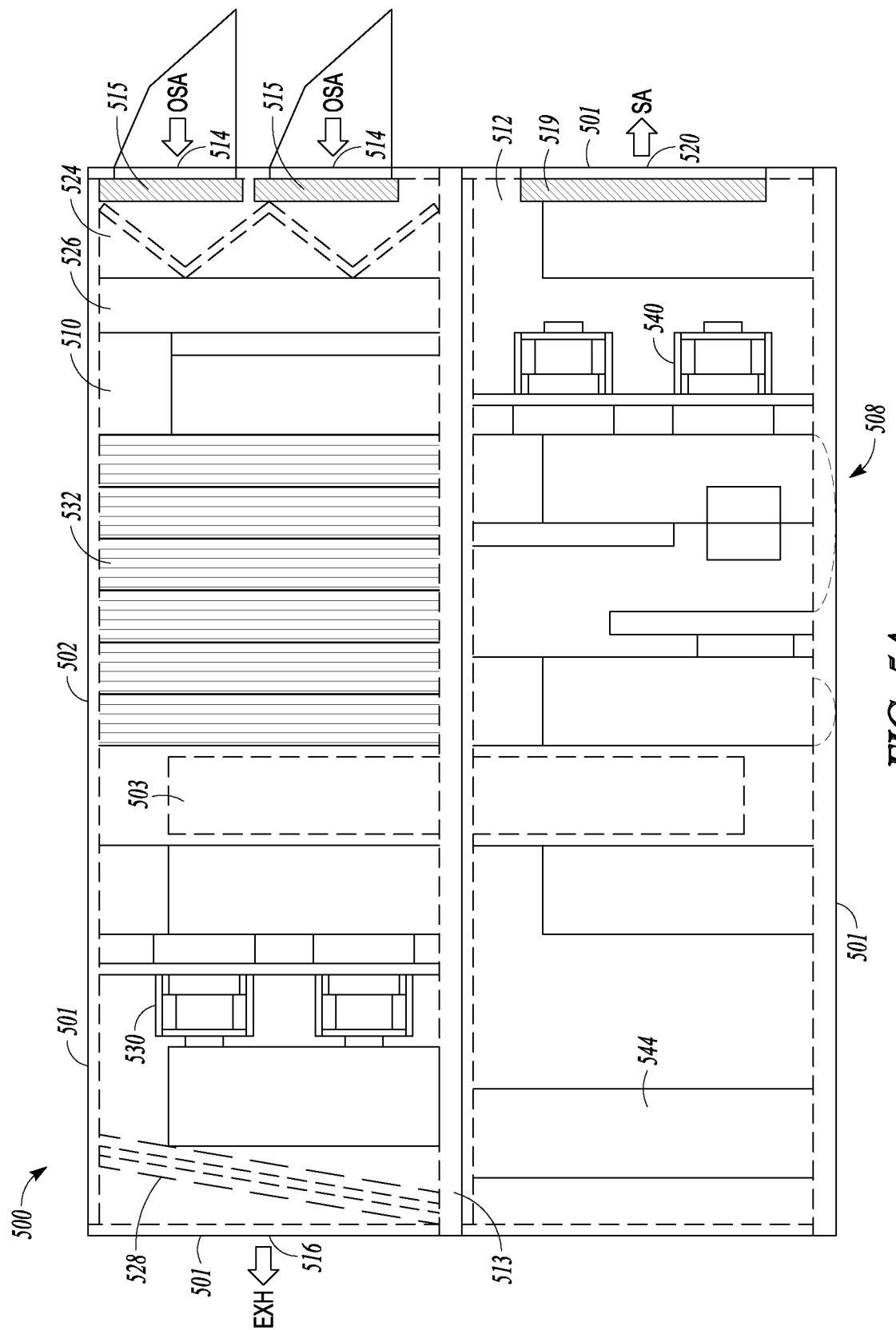
FIG. 5A is a side view of an air-conditioning system with an integrated make-up air system in accordance with the present patent application.
Figure 5B:
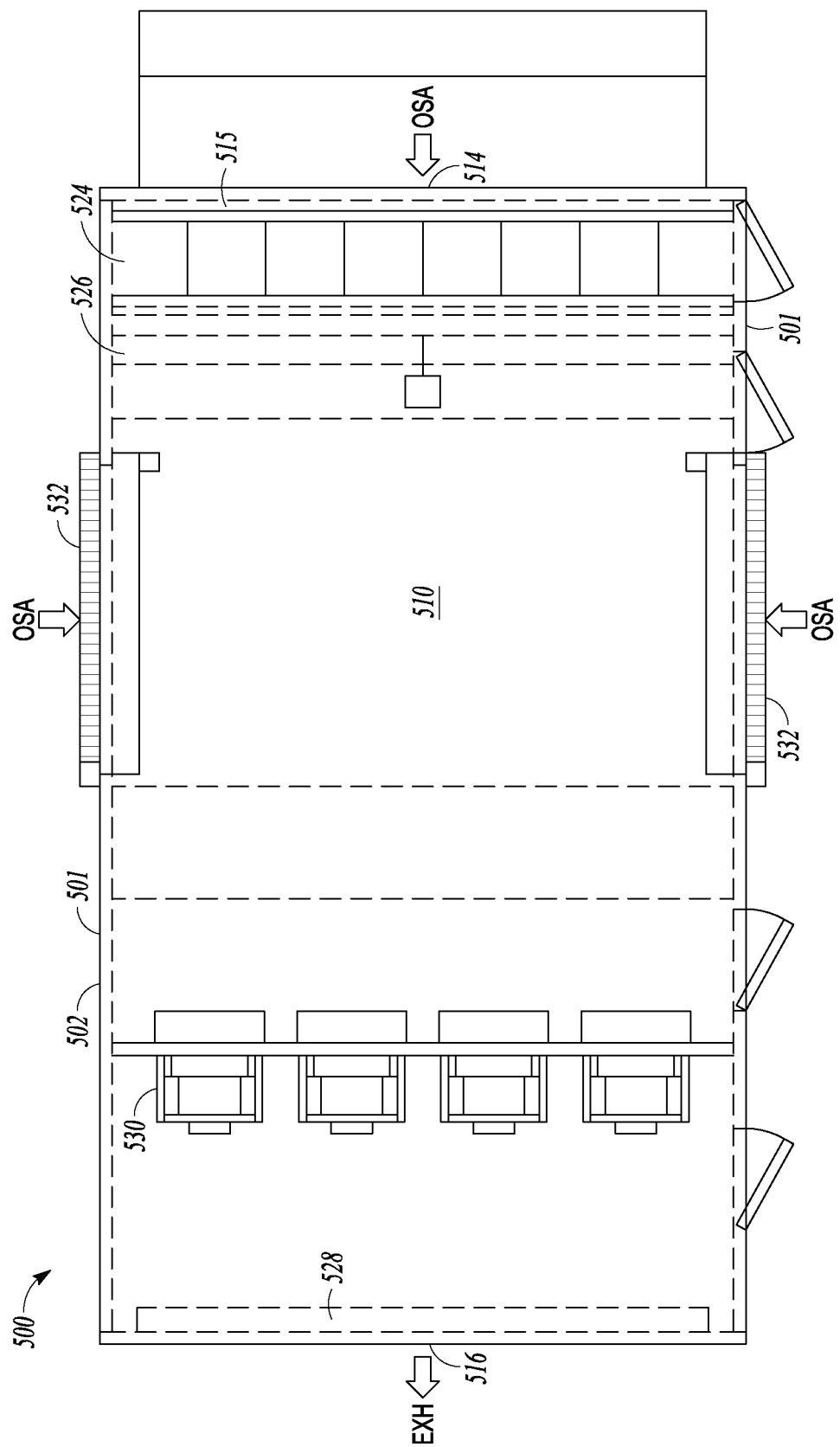
FIG. 5B is a top view of upper sections of the delivery system in FIG. 5A.
Figure 5C:
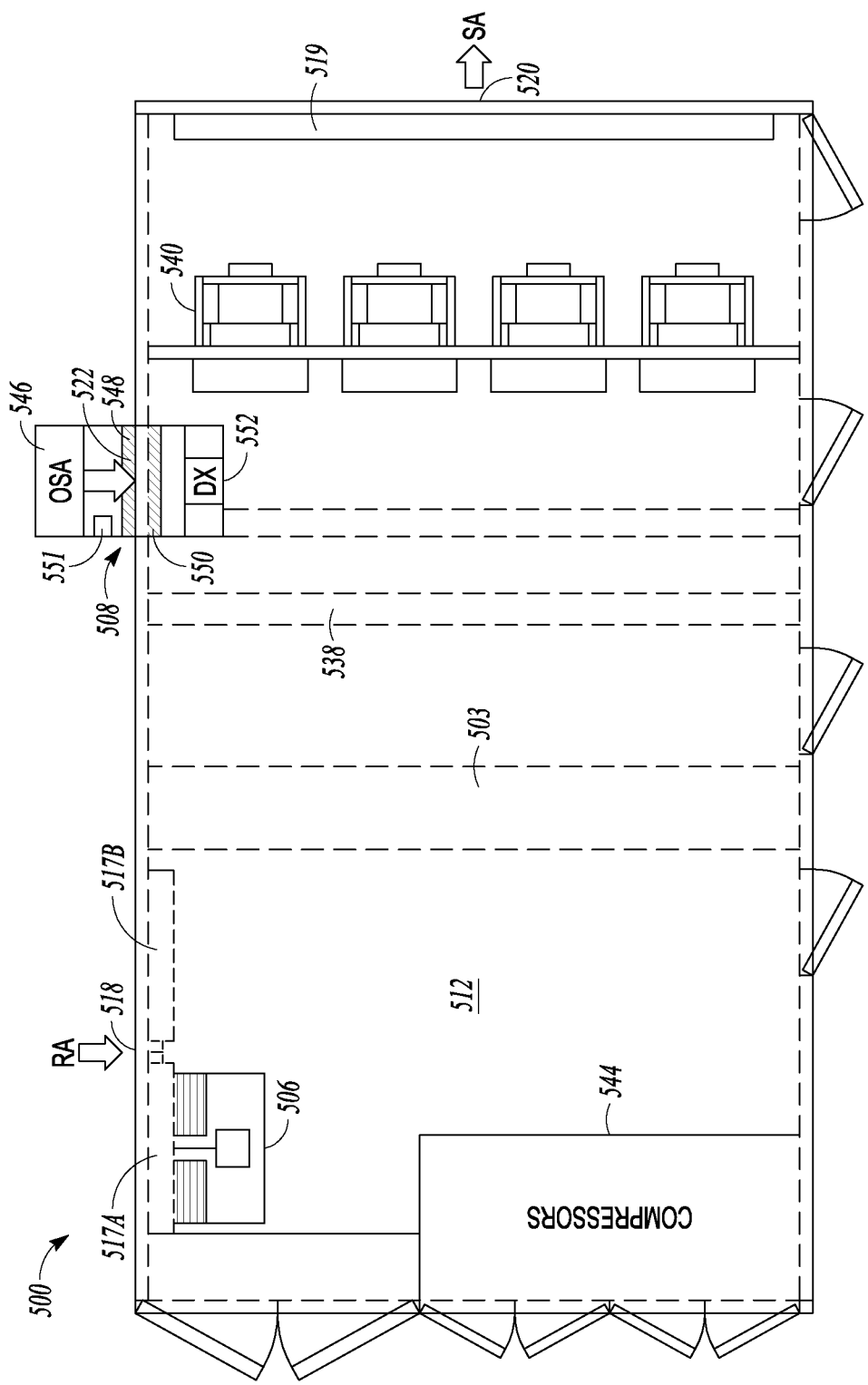
FIG. 5C is a top view of bottom sections of the delivery system in FIG. 5A.

FIGS. 5A-5C depict an example air conditioning system 500 that can be similar to the system 400 of FIG. 4. FIG. 5A is a side view of the system 500 and illustrates a housing 502 formed by exterior walls 501. The housing 502 can include a top level 510 and a bottom level 512. A vertically-oriented sensible wheel 503 can be arranged inside the housing 502 at least partially in the top level 510 and at least partially in the bottom level 512. FIG. 5B is a top view of the top level 510. FIG. 5C is a top view of the bottom level 512.

A flow path of the process air and a flow path of the scavenger air can be similar to the flow paths described above in relation to the system 100 of FIG. 1. Scavenger air can flow through the top level 510, entering at a scavenger air inlet 514 and exiting at a scavenger air outlet 516. The scavenger air inlet 514 can include one or more dampers 513. Process air can flow through the bottom level 512, entering at a process air inlet 518 (which can include dampers 517A and 517B—see FIG. 5C) and exiting at a process air outlet 520 (which can include one or more dampers 519). The levels 510 and 512 can be divided by a partition 513 such that the scavenger and process air streams can remain separate from one another within the housing 502.

The components of the system 500 inside the housing 502 can be similar to those described above in reference to the system 300 of FIGS. 3A-3C. Although similar or comparable components of the system 500 can be located in a different area, as compared to the system 300 of FIGS. 3A-3C, an operation of the components can be substantially the same as described above.

The top level 510 can include a filter 524, a DEC 526 and a bypass damper 532. As shown in FIG. 5B, the bypass damper 532 can include dampers on both walls 301 of the housing 502; it is recognized that the system 500 can include only one bypass damper 532 on one of the two walls 501. The vertically-arranged sensible wheel 503 can be included in the top level 510. Downstream of the sensible wheel 503, the top level 510 can include one or more fans 530 and a condenser coil 528.

The bottom level 512 can include a humidifier 506 (such as, for example, a small DEC) located upstream of the sensible wheel 503. As shown in FIG. 5C, the humidifier 506 can be arranged inside the bottom level 512 such that the process air can be selectively directed through the humidifier 506, or selectively directed around the humidifier 506, depending on the conditions, such as, for example, the outdoor air conditions. In an example, the first damper 517A and the second damper 517B can be used to control a flow of process air through and around the humidifier 506, as described above in reference to the humidifier 306 of the system 300 of FIGS. 3A-3C.

The bottom level 512 can include a DX coil 538 and a make-up air unit 508, both located downstream of the sensible wheel 503. Similar to the make-up air unit 308 shown in FIG. 3C and described above in reference to the system 300, the make-up air unit 508 can include a louver or hood 546, a damper 548 at an air inlet 522, a filter 350, an airflow sensor 351, and a DX coil 552. The bottom level 512 can also include one or more compressors 544 for use with the DX coil 538 and the DX coil 552, as described above in reference to the compressors 344 of the system 300.

In other examples, the make-up air unit 508 of the system 500 can include a heating device, like heating device 354D in FIG. 3D, in place of the DX coil 552 or in addition to the DX coil 552.

Figure 6:
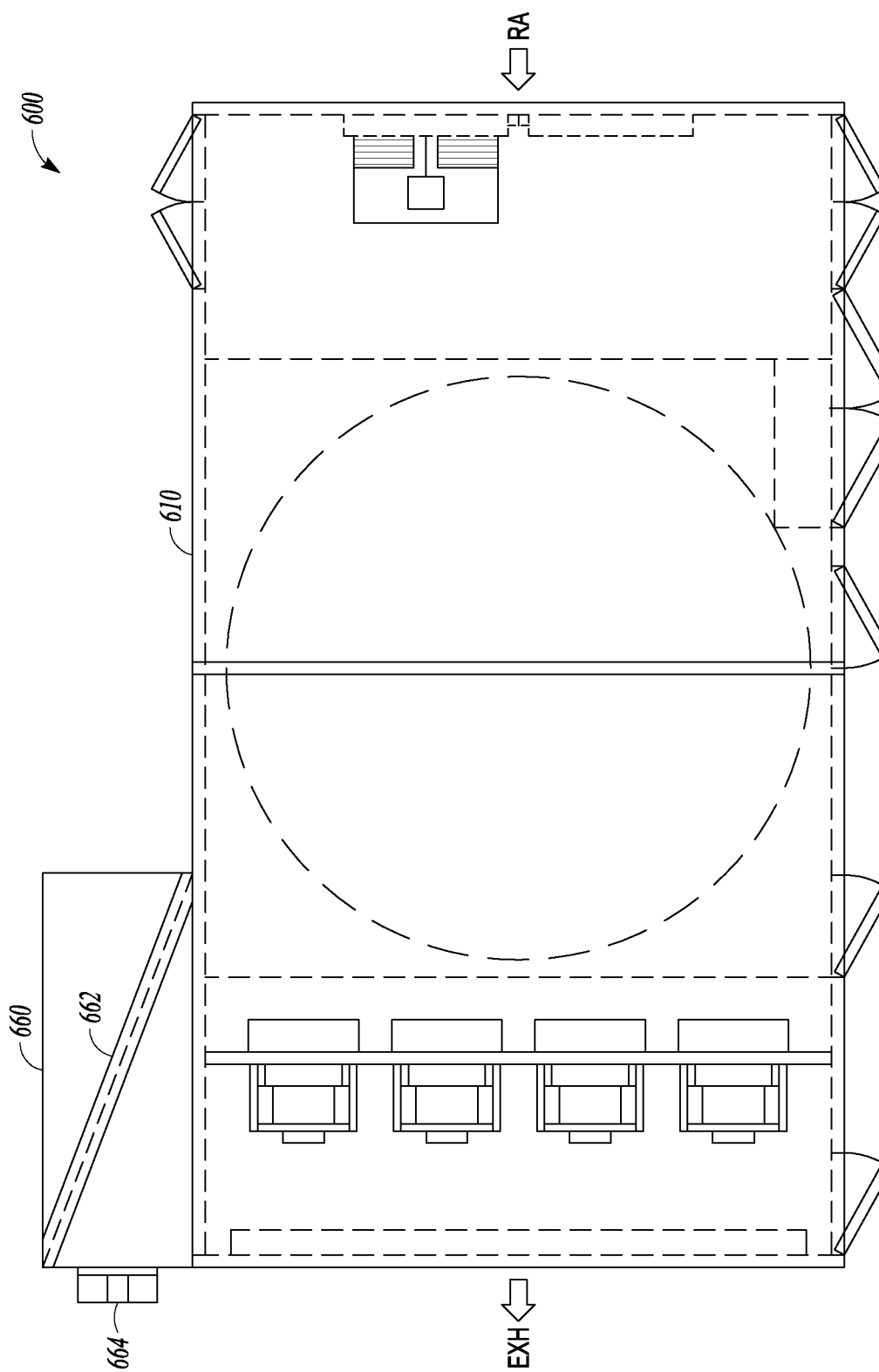
FIG. 6 is a top view of a top portion of an example air-conditioning system with an integrated make-up air system in accordance with the present patent application.

FIG. 6 depicts a top view of a top level 610 of an example air conditioning system 600. The components in the top level 610 can be similar to those in the top level 310 of the system 300 (see FIG. 3B); however, in the example shown in FIG. 6, compressors equivalent to the compressors 344 of FIG. 3B are not shown in the top level 610. It is recognized that one or more compressors could be similarly arranged in the top level 610 or one or more compressors could be located in a different area of the system 600.

Although not shown in FIG. 6, the system 600 can include a make-up air unit similar to the make-up air unit 308 described above and shown in FIG. 5C. A humidifier can be located inside the top level 610 and can function similarly to the humidifier 310 described above in the system 300.

In contrast to the system 300, the system 600 can have an external condenser unit 660 for a DX coil of the make-up air unit. Instead of the condenser for the DX coil being located inside the housing of the system 600, as described above, a condenser coil 662 can be located in the external condenser unit 660, which can be attached to the exterior of the housing. The condenser coil 662 can be in fluid communication with the DX coil for the make-up air unit (i.e. MUA DX coil).

In the example shown in FIG. 6, the condenser unit 660 can be attached to the top level of the system 600. It is recognized that the condenser unit 660 can be attached at other locations on the exterior of the housing. The condenser unit 660 can include one or more fans 664.

The external condenser unit 660 is shown in FIG. 6 in combination with a horizontal wheel. It is recognized that an external condenser coil can be used with any of the air conditioning systems described herein having 100% air recirculation, including, but not limited to, systems having a vertical wheel. A determination as to whether the condenser coil for the MUA DX coil is inside the main housing or external to the main housing may depend, in part, on available space inside the main housing and what other components are included inside the main housing.

The examples provided herein of an integrated make-up air system illustrate the make-up air system in combination with a sensible wheel as the air-to-air heat exchanger (AAHX). It is recognized that other types of air-to-air heat exchangers, including, but not limited to, a counter-flow flat-plate AAHX, a cross-flow flat plate AAHX, a glycol run around system, and a heat pipe, can be used with the integral make-up air systems described herein.

The present disclosure includes methods of conditioning air in an enclosed space, such as, for example, a date center. Methods can include passing a scavenger air stream and a process air stream (from the enclosed space) through a housing including an air-to-air heat exchanger (AAHX), and passing replenishment air through a make-up air unit inside the housing such that replenishment air can be selectively introduced into the process air. In an example, passing the replenishment air through a make-up air unit can include selectively passing the replenishment air through a DX coil to condition the replenishment air. Methods can include selectively passing the process air stream through a humidifier upstream of the AAHX to humidify the process air stream.

The systems described above are examples of 100% air recirculation systems. It is recognized that additional designs and configurations of systems having 100% air recirculation can be used for conditioning air in an enclosed space. Reference is made to application Ser. No. 14/744,950, filed on Jun. 19, 2015, and entitled "SYSTEMS AND METHODS FOR MANAGING CONDITIONS IN ENCLOSED SPACE", which includes additional configurations and details for 100% air recirculation systems. The integral make-up air systems described herein, including a make-up air unit and humidifier, can be used in any of the 100% air recirculation systems disclosed in application Ser. No. 14/744,950.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including"

and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The present application provides for the following exemplary embodiments or examples, the numbering of which is not to be construed as designating levels of importance:

Example 1 provides a system for conditioning air in an enclosed space and can include a housing formed by a plurality of walls that at least partially enclose an interior of the housing, and an air-to-air heat exchanger (AAHX) arranged in the interior of the housing in a flow path of process air between a process air inlet and outlet and in a flow path of scavenger air between a scavenger air inlet and outlet. The system can also include a make-up air unit arranged in the interior of the housing in the flow path of process air downstream of the AAHX and upstream of the process air outlet. The make-up air unit can be configured to deliver replenishment air into the flow path of process air. The make-up air unit can include a damper to selectively prevent and allow replenishment air to enter the flow path of process air, and at least one heating or cooling device to selectively condition the replenishment air entering into the flow path of process air.

Example 2 provides the system of Example 1 optionally configured such that the at least one heating or cooling device includes a DX coil to selectively reduce a temperature of the replenishment air.

Example 3 provides the system of Example 2 optionally further comprising a second DX coil arranged in the flow path of process air between the AAHX and the make-up air unit to provide additional cooling to the process air exiting the AAHX.

Example 4 provides the system of Example 3 optionally configured such that wherein the DX coil of the make-up air unit and the second DX coil are part of a DX system comprising at least one of a plurality of compressors located in a first shared space in the interior of the housing and a plurality of condensers located in a second shared space in the interior of the housing.

Example 5 provides the system of any of Examples 1-4 optionally configured such that the at least one heating or cooling device includes a heating device to selectively increase a temperature of the replenishment air.

Example 6 provides the system of any of Examples 1-5 optionally further comprising a humidifier arranged in the interior of the housing in the flow path of process air between the process air inlet and the AAHX to selectively add humidity to the process air.

Example 7 provides the system of Example 6 optionally configured such that the humidifier is a direct evaporative cooler.

Example 8 provides the system of Example 7 optionally further comprising a first damper at the process air inlet and in fluid connection with the humidifier, and a second damper at the process air inlet. The first damper configured to direct process air through the humidifier and the second damper configured to divert process air around the humidifier.

Example 9 provides the system of any of Examples 1-8 optionally further comprising a filter arranged between the damper and the DX coil.

Example 10 provides the system of any of Examples 1-9 optionally further comprising one or more fans located in the flow path of process air between the make-up air unit and the process air outlet.

Example 11 provides the system of any of Examples 1-10 optionally further comprising a direct evaporative cooler (DEC) arranged in the flow path of the scavenger air between the scavenger air inlet and the AAHX to cool the scavenger air before entering the AAHX.

Example 12 provides the system of any of Examples 1-11 optionally configured such that the scavenger air and the replenishment air are outside air surrounding the housing.

Example 13 provides the system of any of Examples 1-12 optionally configured such that the AAHX is a sensible wheel.

Example 14 provides the system of Example 13 optionally configured such that the sensible wheel is arranged vertically within the housing, and the flow path of the scavenger air is through a top portion of the housing and the flow path of the process air is through a bottom portion of the housing.

Example 15 provides the system of Example 13 optionally configured such that the sensible wheel is arranged horizontally within the housing, and the flow path of the scavenger air is through a first side portion of the housing and the flow path of the process air is through a second side portion of the housing.

Example 16 provides the system of any of Examples 1-15 optionally configured such that the enclosed space is a data center.

Example 17 provides a system for conditioning air in an enclosed space and can include a housing formed by a plurality of walls that define an inside and an outside of the housing, a first side inside portion of the housing, and a second inside portion of the housing. The first inside portion can be configured to receive a flow of scavenger air and can have a scavenger air inlet and outlet. The second inside portion can be configured to receive a flow of process air and can have a process air inlet and outlet. The system can further include a direct evaporative cooler (DEC) arranged in the first inside portion and configured to selectively receive the flow of scavenger air through the DEC to condition the scavenger air, and an air-to-air heat exchanger (AAHX) arranged partially in the first inside portion and partially in the second inside portion. The AAHX can be configured to receive the flow of scavenger air and the flow of process air through the AAHX. The system can further include a humidifier arranged in the second inside portion between the process air inlet and the AAHX to selectively humidify the process air, and a make-up air unit arranged inside the second inside portion between the AAHX and the process air inlet. The make-up air unit can include a damper to selectively introduce replenishment air into the flow of process air in the second inside portion between the AAHX and the process air outlet, a filter to filter the replenishment air, and a cooling component to selectively condition the replenishment air.

Example 18 provides the system of Example 17 optionally configured such that the cooling component is a first DX coil and the system further comprises a DX expansion system comprising the first DX coil, a first condenser coil and a first compressor.

Example 19 provides the system of Example 18 optionally configured such that the DX expansion system comprises a second DX coil arranged in the flow path of process air between the AAHX and the make-up air unit, the second DX coil cooling the process air exiting the AAHX.

Example 20 provides the system of Example 19 optionally configured such that the DX expansion system comprises a second condenser coil associated with the second DX coil, the first and second condenser coils being disposed adjacent to one another within the housing.

Example 21 provides the system of Example 19 optionally configured such that the DX expansion system comprises a second compressor associated with the second DX coil, the first and second compressors being disposed adjacent to one another within the housing.

Example 22 provides the system of any of Examples 17-21 optionally configured such that the make-up air unit further comprises an airflow sensor.

Example 23 provides the system of any of Examples 17-22 optionally configured such that the first inside portion of the housing is a top portion and the second inside portion of the housing is a bottom portion, and the AAHX is a sensible wheel arranged vertically in the housing.

Example 24 provides the system of any of Examples 17-22 optionally configured such that the first inside portion of the housing is a first side portion and the second inside portion of the housing is a second side portion, and the AAHX is a sensible wheel arranged horizontally in the housing.

Example 25 provides the system of any of Examples 17-24 optionally further comprising a partition inside the housing separating the first and second inside portions. The flow of scavenger air and the flow of process air remain separate from one another in the housing, and the scavenger air indirectly and sensibly cools the process air flowing through the AAHX.

Example 26 provides the system of any of Examples 17-25 optionally configured such that the humidifier is a direct evaporative cooler (DEC).

Example 27 provides the system of Example 17 optionally configured such that the cooling component is a DX coil and the system further comprises an external condenser attached to an external side of the housing, and the external condenser is in fluid connection with the DX coil.

Example 28 provides a method of conditioning air in an enclosed space and can include passing scavenger air through a first inside portion of a housing formed by a plurality of walls, the scavenger air entering the first inside portion at a scavenger air inlet and exiting the first inside portion at a scavenger air outlet, and passing process air through a second inside portion of the housing adjacent to the first inside portion, the process air entering the second inside portion at a process air inlet and exiting the second inside portion at a process air outlet. The method can further include passing the scavenger air and the process air through an air-to-air heat exchanger (AAHX) arranged partially in the first inside portion of the housing and partially in the second inside portion of the housing. The cooled scavenger air can sensibly cool the process air in the AAHX. The method can further include passing replenishment air through a make-up air unit in the second inside portion of the housing downstream of the AAHX to selectively introduce replenishment air into the flow of process air.

Example 29 provides the method of Example 28 optionally configured such that passing replenishment air through a make-up air unit includes passing replenishment air through at least one heating or cooling device to condition the replenishment air.

Example 30 provides the method of Example 29 optionally configured such that the at least one heating or cooling device is a DX coil configured to selectively cool and dehumidify the replenishment air.

Example 31 provides the method of Example 30 optionally configured such that the DX coil is part of a DX expansion system comprising one or more condensers in the housing and one or more compressors in the housing.

Example 32 provides the method of Example 31 optionally configured such that the DX expansion system further comprises a second DX coil in the second inside portion of the housing to provide additional cooling to the process air exiting the AAHX.

Example 33 provides the method of any of Examples 29-32 optionally configured such that the at least one heating or cooling device is a heating device configured to selectively increase a temperature of the replenishment air.

Example 34 provides the method of any of Examples 28-33 optionally configured such that passing replenishment air through a make-up air unit includes passing replenishment air through a filter.

Example 35 provides the method of any of Examples 28-34 optionally configured such that wherein passing replenishment air through a make-up air unit includes using a damper to prevent and allow replenishment air to enter into the second inside portion of the housing.

Example 36 provides the method of Example 35 optionally further comprising adjusting a position of the damper to control a volume of replenishment air entering into the second inside portion of the housing.

Example 37 provides the method of any of Examples 28-36 optionally further comprising passing the process air through a direct evaporative cooler (DEC) in the second inside portion of the housing between the process air inlet and the AAHX to selectively humidify the process air.

Example 38 provides the method of any of Examples 28-37 optionally further comprising passing the scavenger air through a direct evaporative cooler (DEC) in the first inside portion of the housing between the scavenger air inlet and the AAHX, wherein the DEC conditions the scavenger air prior to entering the AAHX.

Example 39 provides a system or method of any one or any combination of Examples 1-38, which can be optionally configured such that all steps or elements recited are available to use or select from.

Various aspects of the disclosure have been described. These and other aspects are within the scope of the following claims.

What is claimed is:

1. A system for conditioning air in an enclosed space, the system comprising:
    a housing formed by a plurality of walls that at least partially enclose an interior of the housing;
    an air-to-air heat exchanger (AAHX) arranged in the interior of the housing in a flow path of process air between a process air inlet and outlet and in a flow path of scavenger air between a scavenger air inlet and outlet; and
    a make-up air unit arranged in the interior of the housing in the flow path of process air downstream of the AAHX and upstream of the process air outlet, the make-up air unit configured to deliver replenishment air into the flow path of process air, the make-up air unit comprising:
        a damper to selectively prevent and allow replenishment air to enter the flow path of process air; and
        at least one heating or cooling device to selectively condition the replenishment air entering into the flow path of process air.

2. The system of claim 1 wherein the at least one heating or cooling device includes a DX coil to selectively reduce a temperature of the replenishment air.

3. The system of claim 2 further comprising
    a second DX coil arranged in the flow path of process air between the AMAX and the make-up air unit to provide additional cooling to the process air exiting the AAHX.

4. The system of claim 3 wherein the DX coil of the make-up air unit and the second DX coil are part of a DX system comprising at least one of a plurality of compressors located in a first shared space in the interior of the housing and a plurality of condensers located in a second shared space in the interior of the housing.

5. The system of claim 1 wherein the at least one heating or cooling device includes a heating device to selectively increase a temperature of the replenishment air.

6. The system of claim 1 further comprising:
    a humidifier arranged in the interior of the housing in the flow path of process air between the process air inlet and the AAHX to selectively add humidity to the process air.

7. The system of claim 6 wherein the humidifier is a direct evaporative cooler.

8. The system of claim 6 further comprising:
    a first damper at the process air inlet and in fluid connection with the humidifier, the first damper configured to direct process air through the humidifier; and
    a second damper at the process air inlet and configured to divert process air around the humidifier.

9. The system of claim 1 further comprising one or more fans located in the flow path of process air between the make-up air unit and the process air outlet.

10. The system of claim 1 further comprising a direct evaporative cooler (DEC) arranged in the flow path of the scavenger air between the scavenger air inlet and the AAHX to cool the scavenger air before entering the AAHX.

11. The system of claim 1 wherein the AAHX is a sensible wheel arranged vertically within the housing, and the flow path of the scavenger air is through a top portion of the housing and the flow path of the process air is through a bottom portion of the housing.

12. The system of claim 1 wherein the AAHX is a sensible wheel arranged horizontally within the housing, and the flow path of the scavenger air is through a first side portion of the housing and the flow path of the process air is through a second side portion of the housing.

13. The system of claim 1 wherein the enclosed space is a data center.

14. A system for conditioning air in an enclosed space, the system comprising:
    a housing formed by a plurality of walls that define an inside and an outside of the housing;
    a first inside portion of the housing configured to receive a flow of scavenger air, the first inside portion having a scavenger air inlet and outlet;
    a second inside portion of the housing configured to receive a flow of process air, the second inside portion having a process air inlet and outlet;

a direct evaporative cooler (DEC) arranged in the first inside portion and configured to selectively receive the flow of scavenger air through the DEC to condition the scavenger air;

an air-to-air heat exchanger (AAHX) arranged partially in the first inside portion and partially in the second inside portion, the AAHX configured to receive the flow of scavenger air and the flow of process air through the AAHX;

a humidifier arranged in the second inside portion between the process air inlet and the AAHX to selectively humidify the process air; and a make-up air unit arranged inside the second inside portion between the AAHX and the process air inlet, the make-up air unit comprising:
  a damper to selectively introduce replenishment air into the flow of process air in the second inside portion between the AAHX and the process air outlet;
  a filter to filter the replenishment air prior to introducing the replenishment air into the flow of process air; and
  a cooling component to selectively condition the replenishment air.

15. The system of claim 14 wherein the cooling component is a first DX coil and the system further comprises a DX expansion system comprising:
  the first DX coil;
  a first condenser coil; and
  a first compressor.

16. The system of claim 15 wherein the DX expansion system comprises a second DX coil arranged in the flow path of process air between the AAHX and the make-up air unit, the second DX coil cooling the process air exiting the AAHX.

17. The system of claim 16 wherein the DX expansion system comprises a second condenser coil associated with the second DX coil, the first and second condenser coils being disposed adjacent to one another within the housing.

18. The system of claim 16 wherein the DX expansion system comprises a second compressor associated with the second DX coil, the first and second compressors being disposed adjacent to one another within the housing.

19. The system of claim 14 wherein the make-up air unit further comprises an airflow sensor.

20. The system of claim 14 further comprising a partition inside the housing separating the first and second inside portions, wherein the flow of scavenger air and the flow of process air remain separate from one another in the housing, and the scavenger air indirectly and sensibly cools the process air flowing through the AAHX.

21. The system of claim 14 wherein the cooling component is a DX coil and the system further comprises an external condenser attached to an external side of the housing, and the external condenser is in fluid connection with the DX coil.

* * * * *

UNITED STATES PATENT AND TRADEMARK OFFICE
CERTIFICATE OF CORRECTION

PATENT NO. : 10,834,855 B2
APPLICATION NO. : 16/067446
DATED : November 10, 2020
INVENTOR(S) : Ghadiri Moghaddam et al.

It is certified that error appears in the above-identified patent and that said Letters Patent is hereby corrected as shown below:

On the Title Page

On page 3, in Column 2, under "Other Publications", Line 28, after "filed", insert --Aug. 31, 2018 to--

On page 4, in Column 1, under "Other Publications", Line 40, delete "Dec. 29, 2016"," and insert --Sep. 1, 2015",-- therefor In the Claims In Column 22, Line 15, in Claim 3, delete "AMAX" and insert --AAHX-- therefor Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*